United States Patent [19]
Lear

[11] Patent Number: 5,568,499
[45] Date of Patent: Oct. 22, 1996

[54] OPTICAL DEVICE WITH LOW ELECTRICAL AND THERMAL RESISTANCE BRAGG REFLECTORS

[75] Inventor: Kevin L. Lear, Albuquerque, N.M.

[73] Assignee: Sandia Corporation, Albuquerque, N.M.

[21] Appl. No.: 418,730

[22] Filed: Apr. 7, 1995

[51] Int. Cl.$^6$ ........................................ H01S 3/19
[52] U.S. Cl. ..................... 372/45; 257/21; 257/97; 257/98; 372/96; 372/99
[58] Field of Search ........................ 372/92, 45, 46, 372/96, 99; 257/21, 97, 98

[56] References Cited

U.S. PATENT DOCUMENTS

| | | | |
|---|---|---|---|
| 5,012,486 | 4/1991 | Luryi | 372/45 |
| 5,115,442 | 5/1992 | Lee | 372/45 |
| 5,136,345 | 8/1992 | Kasahara | 357/4 |
| 5,170,407 | 12/1992 | Shubert | 372/96 |
| 5,208,820 | 5/1993 | Kurihara | 372/45 |
| 5,212,703 | 5/1993 | Kahen | 372/46 |
| 5,213,995 | 5/1993 | Chen | 437/126 |
| 5,237,581 | 8/1993 | Asada | 372/45 |
| 5,355,000 | 10/1994 | Delacourt et al. | 257/21 |
| 5,379,719 | 1/1995 | Chalmers | 117/89 |
| 5,397,739 | 3/1995 | Chalmers | 437/129 |
| 5,424,559 | 6/1995 | Kasahara | 372/46 |
| 5,442,203 | 8/1995 | Adomi et al. | 372/96 |

OTHER PUBLICATIONS

S. Adachi, "GaAs, AlAs, and $Al_xGa_{1-x}As$: Material Parameters for Use in Research and Device Applications," *Journal of Applied Physics*, vol. 58, pp. R1–R29, 1 Aug. 1985.
R. S. Geels, S. W. Corzine, J. W. Scott, D. B. Young, and L. A. Coldren, "Low Threshold Planarized Vertical–Cavity Surface–Emitting Lasers," *IEEE Photonics Technology Letters*, vol. 2, pp. 234–236, Apr. 1990.
K. Tai, L. Yang, Y. H. Wang, J. D. Wynn, and A. Y. Cho, "Drastic Reduction in Series Resistance in Doped Semiconductor Distributed Bragg Reflectors for Surface–Emitting Lasers," *Applied Physics Letters*, vol. 56, pp. 2496–2498, 18 Jun. 1990.
E. F. Shubert, L. W. Tu, G. J. Zydzik, R. F. Kopf, A. Benvenuti, and M. R. Pinto, "Elimination of Heterojunction Band Discontinuities by Modulation Doping," *Applied Physics Letters*, vol. 60, pp. 466–468, 27 Jan. 1992.
R. F. Kopf, E. F. Shubert, S. W. Downey, and A. B. Emerson, "N– and P–Type Dopant Profiles in Distributed Bragg Reflector Structures and Their Effect on Resistance," *Applied Physics Letters*, vol. 61, pp. 1820–1822, 12 Oct. 1992.
S. A. Chalmers, K. L. Lear, and K. P. Killeen, "Low Resistance Wavelength–Reproducible P–Type (Al,Ga)As Distributed Bragg Reflectors Grown by Molecular Beam Epitaxy," *Applied Physics Letters*, vol. 62, pp. 1585–1587, 5 Apr. 1993.
M. G. Peters, B. J. Thibeault, D. B. Young, J. W. Scott, F. H. Peters, A. C. Gossard, and L. A. Coldren, "Band–Gap Engineered Digital Alloy Interfaces for Lower Resistance Vertical–Cavity Surface–Emitting Lasers," *Applied Physics Letters*, vol. 63, pp. 3411–3413, 30 Dec. 1993.

(List continued on next page.)

*Primary Examiner*—James W. Davie
*Attorney, Agent, or Firm*—John P. Hohimer

[57] ABSTRACT

A compound-semiconductor optical device and method. The optical device is provided with one or more asymmetrically-graded heterojunctions between compound semiconductor layers for forming a distributed Bragg reflector mirror having an improved electrical and thermal resistance. Efficient light-emitting devices such as light-emitting diodes, resonant-cavity light-emitting diodes, and vertical-cavity surface-emitting lasers may be formed according to the present invention, which may be applied to the formation of resonant-cavity photodetectors.

34 Claims, 11 Drawing Sheets

OTHER PUBLICATIONS

K. L. Lear, R. P. Schneider, Jr., S. P. Kilcoyne, and J. J. Figiel, "Mirror Designs for Low–Voltage Vertical–Cavity Surface–Emitting Lasers by Metalorganic Vapor Phase Epitaxy," *IEEE Conference on Lasers and Electro–Optics Technical Digest*, pp. 30–31, 8 May 1994.

K. Lear, S. P. Kilcoyne, and S. A. Chalmers, "High Power Conversion Efficiencies and Scaling Issues for Multimode Vertical–Cavity Top–Surface–Emitting Lasers," *IEEE Photonics Technology Letters*, vol. 6, pp. 778–781, Jul. 1994.

K. Lear, R. P. Schneider, K. D. Choquette, S. P. Kilcoyne, J. J. Figiel, and J. C. Zolper, "Vertical Cavity Surface Emitting Lasers with 21% Efficiency by Metalorganic Vapor Phase Epitaxy," *IEEE Photonics Technology Letters*, vol. 6, pp. 1053–1055, Sep. 1994.

K. D. Choquette, R. P. Schneider, Jr., K. L. Lear, and K. M. Geib, "Low Threshold Voltage Vertical–Cavity Lasers Fabricated by Selective Oxidation," *Electronics Letters*, vol. 30, pp. 2043–2044, 24 Nov. 1994.

"Prior Art"

"Prior Art"

OPTICAL DEVICE WITH LOW ELECTRICAL AND THERMAL RESISTANCE BRAGG REFLECTORS

This invention was made with Government support under Contract No. DE-AC04-94AL85000 awarded by the U.S. Department of Energy. The Government has certain rights in the invention.

FIELD OF THE INVENTION

The present invention relates generally to a semiconductor optical device and, more particularly, to devices such as light-emitting diodes, resonant-cavity light-emitting diodes, vertical-cavity surface-emitting lasers, and resonant-cavity photodetectors; and to electrical or optical structures having one or more asymmetrically-graded heterojunctions between compound semiconductor layers therein. A method for fabricating an optical device is also described.

BACKGROUND OF THE INVENTION

Vertically-oriented optical devices may comprise multi-layered reflecting structures such as distributed Bragg reflector (DBR) mirrors forming a resonant cavity perpendicular to a surface of a semiconductor wafer on which the devices are fabricated; and these optical devices may include both light-emitting devices such as vertical-cavity surface-emitting lasers (VCSELs) and resonant-cavity light-emitting diodes (RCLEDs), and also light-detecting devices such as resonant-cavity photodetectors (RCPDs). Such vertically-oriented optical devices are becoming increasingly important for a wide variety of applications including optical interconnection of integrated circuits, optical computing systems, optical recording and readout systems, and telecommunications.

Vertically-oriented light-emitting and light-detecting optical devices have very similar device structures comprising an active region sandwiched between a pair of DBR mirrors with a semiconductor p-n or p-i-n junction formed about the active region. When an electrical bias voltage is applied across the junction, light may be generated within the active region for a forward biasing of the junction; and light received into the active region may be detected for a reverse biasing of the junction.

A particular problem in the development of vertically-oriented light-emitting devices, and especially for VCSELs, has been a substantial voltage drop across the DBR mirrors as compared to the voltage drop across the active region wherein light is generated. Each DBR mirror is a unipolar heterostructure consisting of alternating one-quarter-wavelength thick layers of two different semiconductors of the same conductivity type (e.g. n-type or p-type) having different indices of refraction. Heterojunction energy band discontinuities between adjacent semiconductor layers in each DBR mirror may form potential barriers between the semiconductor layers due to offsets in a conduction band, or a valence band or both that gives rise to the voltage drop across the DBR mirror. For a VCSEL, this voltage drop increases a bias voltage across the device and produces excess heating therein, thereby deteriorating device efficiency and performance. Attempts have been made to reduce the voltage drop due to the DBR mirrors (especially the p-type mirror) in VCSELs by composition grading a region about each heterojunction in the mirrors so that a semiconductor alloy composition is smoothly graded from each semiconductor layer to an adjacent semiconductor layer.

The teaching of the prior art as disclosed, for example, in U.S. Pat. No. 5,170,407 to Shubert et al and in U.S. Pat. No. 5,379,719 to Chalmers et al has been to vary the composition on both sides of each heterojunction in the DBR mirrors in a light-emitting device in a gradual (i.e. continuous) manner (as averaged over an electrostatic screening distance or Debye length of carriers such as electrons or holes), and to avoid any discontinuities or abrupt changes in composition about the heterojunction. The teaching of the prior art has further been to eliminate any possible asymmetries within the DBR mirrors, including asymmetries about the heterojunctions therein. To this end, it has been taught in the prior art that a composition-graded region on each side of a heterojunction should be treated substantially identically, including making each region substantially identical in thickness in the growth direction and uniformly composition grading each region symmetrically about a point of inversion located at a midpoint of the heterojunction between the semiconductor layers of a DBR mirror. Furthermore, the prior art teaches that composition grading should take substantially the same shape on each side of the heterojunction (e.g. linear, piecewise linear, or semiparabolic) to smooth out or flatten the energy band on each side of the heterojunction.

Continuously-graded heterojunctions as required in the prior art are difficult to grow, especially for transitions from a binary semiconductor alloy composition (e.g. GaAs) to a ternary semiconductor alloy composition (e.g. $Al_xGa_{1-x}As$) as may be required for continuously grading a heterojunction that includes at least one binary alloy composition therein. This difficulty arises from the need to grow a semiconductor alloy having less than about 10% of a constituent element, for which uncertainties in composition and growth rate may occur due to limitations of present day epitaxial growth methods such as molecular beam epitaxy (MBE) and metal-organic chemical vapor deposition (MOCVD). For example, in the case of MBE, such uncertainties may arise from a low temperature of a source cell needed to provide a low beam flux of a minority constituent element of the ternary alloy, and a nonlinear dependence of the beam flux on the source cell temperature. Additional uncertainties in composition and growth rate may occur from repeated ramping (i.e. a cyclical variation) of the source cell temperature for growing of a plurality of semiconductor layers and graded heterojunctions to form a DBR mirror.

Another method for grading heterointerfaces within DBR mirrors by MBE has been the use of rapid shutter sequencing to alternately grow many alternating very thin layers of a first binary alloy composition (e.g. GaAs) and a second binary alloy composition (e.g. AlAs) forming a superlattice having nanometer-scale layer thicknesses, with the thickness of each binary alloy layer being varied uniformly for generating an approximation to a smooth continuous composition grading about each heterojunction in the mirrors. (Such a binary alloy superlattice as seen by electrons and holes may approximate a smooth continuous composition graded heterojunction if the thickness of each binary alloy layer is smaller than a tunneling distance for the electrons or holes.) However, such rapid shutter sequencing is disadvantageous, especially from a manufacturing standpoint, due to the very large number (up to a thousand or more) of shutter operations that may be required for the fabrication of a light-emitting device having up to twenty or more heterojunctions within each DBR mirror. The prior-art MBE composition-grading approaches have been successful at reducing the voltage drop and series electrical resistance in DBR mirrors, but often at the expense of other important properties of the mirrors.

When using MOCVD for growing DBR mirrors, composition and growth rate uncertainties may also arise due to the need to control a very small gas flow for providing a minority constituent element of a tarnary alloy (e.g. less than about 10%). Mass flow controllers used by MOCVD to regulate the flow of gases for growing the semiconductor layers have a limited dynamic range which makes it difficult to control a small flow of gas for smoothly grading a heterojunction between two binary-alloy semiconductor layers.

Due to the limitations of the prior art, DBR mirrors have been largely comprised of either all-binary alloy composition semiconductor layers or all-ternary alloy composition semiconductor layers. The all-binary alloy DBR mirrors were grown by MBE with rapid shutter sequencing; but this approach is undesirable for manufacturing. The all-ternary alloy DBR mirrors (e.g. alternating $Al_{0.1}Ga_{0.9}As$ and $Al_{0.9}Ga_{0.1}As$ semiconductor layers with smoothly graded ternary alloy heterojunctions therebetween) were grown by MOCVD with mass flow control, or by MBE with source cell temperature ramping; and these approaches are undesirable due to the reduced reflectivity of each pair of semiconductor layers, and the resultant need for additional pairs of semiconductor layers to form a high reflectivity DBR mirror. In addition, the all-ternary alloy DBR mirrors have poorer thermal properties than the all-binary mirrors due to an increased alloy scattering. The higher thermal resistivity of ternary alloy semiconductors as compared to binary alloy semiconductors is disclosed, for example, in an article by S. Adachi entitled "GaAs, AlAs, $Al_xGa_{1-x}As$: *Material Parameters for Use in Research and Device Applications*", published in Journal of Applied Physics, volume 58, pages R1–R29, Aug. 1, 1985 (see especially FIG. 12 therein).

What is needed is a method for fabricating optical devices comprising DBR mirrors that optimizes these mirrors not only to provide a low voltage drop therein, but also to optimize the mirrors for many other factors that affect device efficiency and performance, including lateral electrical resistance, thermal resistance, layer uniformity, and manufacturability. Such a comprehensive approach for fabricating DBR mirrors has been lacking in the prior art.

An advantage of the optical device and method of the present invention is that an optical device having one or more DBR mirrors may be fabricated considering optical, electrical, and thermal properties of the mirrors, with these properties substantially optimized for overall device efficiency and performance.

Another advantage of the optical device and method of the present invention is that one or more abrupt changes in composition about a heterojunction may be used to advantage to reduce uncertainties in growth rate, and to reduce a lateral electrical resistance to current flow within the device, thereby improving device efficiency and performance.

A further advantage of the optical device and method of the present invention is that an MOCVD growth method suited to volume manufacturing may be used to fabricate optical devices having a high efficiency for light generation.

These and other advantages of the optical device and method of the present invention will become evident to those skilled in the art.

SUMMARY OF THE INVENTION

Accordingly, it is a primary object of the present invention to provide an optical device and method for fabricating the same which overcomes the drawbacks of the prior art.

Another object of the present invention is to provide an efficient optical device having one or more DBR mirrors with a low voltage drop and a low thermal resistance, and a high reflectivity for each pair of semiconductor layers therein.

Another object of the present invention is to provide an optical device that may be fabricated more easily and simply than the prior art, including fabrication by a MOCVD growth process.

A further object of the present invention is to provide an optical device having improved optical and thermal properties, including a high reflectivity for each pair of semiconductor layers within a DBR mirror; and to further provide a reduced operating temperature for the device by reducing a lateral electrical resistance and a series electrical resistance within the mirror, and by reducing a thermal resistance therein.

Still another object of the present invention is to provide an optical device and method in which a ternary semiconductor alloy composition within one or more DBR mirrors is minimized and a binary semiconductor alloy composition within the mirrors is maximized, thereby enhancing a thermal conductivity and reducing a thermal resistance in the mirrors.

Yet another object of the present invention is to provide an optical device and method in which a thickness of each heterojunction within a DBR mirror is reduced, thereby reducing a thermal resistance in the DBR mirror and enhancing a reflectivity of each pair of semiconductor layers in the mirror, with the result that the number of pairs of semiconductor layers for attaining a particular reflectivity value for the mirror may be reduced.

Another object of the present invention is to provide an improved optical device with a high efficiency for light generation or light detection and a method for fabricating the same wherein a depletion region on one side of each heterojunction adjacent to a higher-bandgap semiconductor layer is substantially smoothly varied in composition to reduce a potential barrier therein for reducing a voltage drop and a series electrical resistance within the DBR mirror; and an accumulation region on the opposite side of each heterojunction is abruptly graded in composition to collect carriers (i.e. electrons and holes) therein and to enhance a lateral flow of the carriers for reducing lateral electrical and thermal resistances within the DBR mirror.

An additional object of the present invention is to provide an optical device with one or more DBR mirrors in which a smoothly varying semiconductor alloy composition grading is preferably largely confined to a depletion region on one side of each heterojunction adjacent to a higher-bandgap semiconductor layer where the smoothly varying composition grading provides the greatest benefit for reducing a series electrical resistance and voltage drop.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, an optical device and method are provided. The optical device preferably comprises, on a semiconductor substrate, n-type and p-type semiconductor distributed Bragg reflector (DBR) mirrors, each mirror having at least one pair of compound semiconductor layers epitaxially grown one upon another, one layer in each pair of semiconductor layers having an index of refraction which is different from the index of refraction of the other layer in each pair of semiconductor layers. Any two adjacent semiconductor layers of the DBR mirror form a heterojunction, with a first layer of the two adjacent layers having a first composition and a first bandgap, and a second layer of the two adjacent layers having a second composition and a second bandgap, the second bandgap being greater than the first bandgap.

In one embodiment of the present invention, each heterojunction has a first region adjacent to the first layer that is composition graded beginning with the first composition and ending with a third composition intermediate between the first and second compositions, and a second region adjacent to the second layer that is composition graded beginning with the third composition and ending with the second composition, the second region having a smaller variation in composition with distance in the growth direction than the first region, thereby producing an asymmetrically-graded heterojunction.

In another embodiment of the present invention, the first region of each heterojunction may be abruptly varied in composition from the first composition to the third composition; whereas the second region adjacent of each heterojunction is preferably smoothly varied in composition from the third composition to the second composition, again producing an asymmetrically-graded heterojunction.

In other embodiments of the present invention, the optical device preferably includes an active region formed between the n-type and p-type mirrors, and electrodes operatively connected to the n-type and p-type mirrors for applying a bias voltage to the device.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
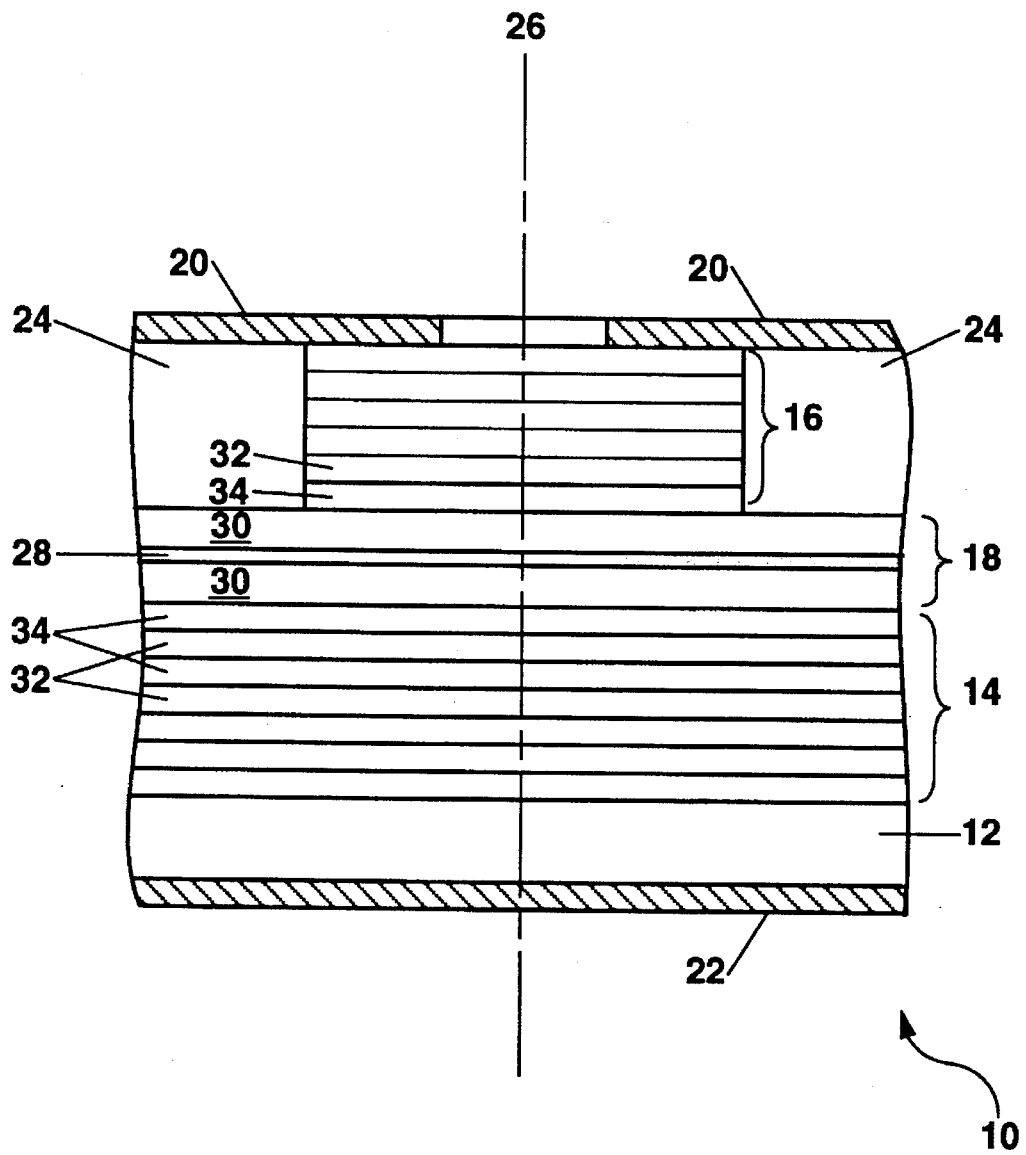
FIG. 1 shows a schematic diagram of a first embodiment of an optical device according to the present invention.

As shown in FIG. 1, the structure of the optical device 10 of the present invention is a layered structure in which light is emitted or detected in a vertical direction that is substantially perpendicular to the planes of the layers. In a first embodiment of an optical device in FIG. 1, the optical device 10 preferably comprises on a semiconductor substrate 12 a plurality of epitaxially-grown compound semiconductor layers forming a first DBR mirror 14 (above the substrate) and a second DBR mirror 16 with an active region 18 sandwiched therebetween. An upper electrode 20 overlies the second DBR mirror 16; and a lower electrode 22 underlies the substrate 12. The second DBR mirror 16 is preferably patterned to provide an annular current-blocking region 24 about a central portion that is centered about an optical axis 26 of the second DBR mirror in the device 10.

The optical device 10 according to the present invention may be formed from III–V or II–VI compound semiconductor materials, with various embodiments of the invention being in the form of a vertical-cavity surface-emitting laser (VCSEL), a resonant-cavity light emitting diode (RCLED), a light-emitting diode (LED), and a resonant-cavity photodetector (RCPD).

For a VCSEL device 10 according to the first embodiment of the present invention, the DBR mirrors (14 and 16) are preferably made highly reflective. One of the mirrors preferably has a reflectivity of about 99% or more; and the other mirror (i.e. an output coupling mirror) preferably has a slightly lower reflectivity (e.g. about 95–99%) to allow for coupling of a portion of the lasing light out from a resonant optical cavity formed by the mirrors.

An RCLED device 10 according to the first embodiment of the present invention may be formed by further lowering the reflectivity of the output coupling mirror to about 90% by reducing the number of pairs of semiconductor layers in the output coupling mirror. For forming an LED device 10 according to the present invention, the number of pairs of semiconductor layers in the output coupling mirror may be further reduced in number (including providing only a single pair of semiconductor layers for the output coupling mirror) to increase the output coupling of light generated within the active region 18 when the device is forward biased. An RCPD device 10 may be formed in a manner similar to a VCSEL or RCLED, with the active region 18 being reverse-biased for detecting an external light beam received into the active region of the RCPD device.

The semiconductor substrate 12 (i.e. a semiconductor wafer) may be GaAs, InP, or the like; and may be doped, for example, n-type with Si (about $10^{18}$ cm$^{-3}$). The substrate 12 as defined herein may include one or more buffer layers (of the same doping type of the substrate) epitaxially grown thereon for smoothing or conditioning an upper surface of the substrate prior to growth of the first DBR mirror 14.

A plurality of semiconductor layers are epitaxially grown on the substrate 12 by metal-organic chemical vapor deposition (MOCVD), molecular beam epitaxy (MBE), or the like for forming the device 10. The semiconductor layers are formed from III–V or II–VI compound semiconductor alloy materials including GaAs, AlAs, InP, AlGaAs, InGaAs, InAlAs, InGaP, AlGaAsP, AlGaInP, InGaAsP, InAlGaAs, or the like.

The first DBR mirror 14 is grown above the substrate and is a unipolar structure, having a doping type that is preferably of the same polarity as the substrate 12 (e.g. n-type doped with Si to about $5\times10^{17}$ cm$^{-3}$ or greater). The first DBR mirror comprises at least one pair of semiconductor layers (and preferably about 10 or more pairs of semiconductor layers epitaxially grown one upon another), with one layer (e.g. a high-refractive-index first layer 32) in each pair having an index of refraction which is different from the index of refraction of the other layer (e.g. a low-refractive-index second layer 34) in each pair. The semiconductor layers within each DBR mirror in the optical device 10 are preferably about one-quarter-wavelength thick (or an odd multiple of one-quarter-wavelength) for a wavelength of operation of the device so that a reflection of light from each pair of semiconductor layers is additive.

An active region 18 is grown above the first DBR mirror 14. The active region 18 preferably comprises an active layer 28 sandwiched between a pair of cladding layers 30. The active layer 28 may comprise a bulk semiconductor layer having a thickness of up to 1500 nanometers or more; or the active layer may comprise one or more quantum-well layers (defined herein as semiconductor layers providing a quantum confinement of electrons and holes therein by means of one or more quantum wells, quantum wires, or quantum dots). The active layer 28 (either a bulk layer, or one or more quantum-well layers) may comprise a III–V or II–VI compound semiconductor alloy, with a particular semiconductor alloy selected to provide a specified wavelength range of use of the device 10. III–V compound semiconductor alloys that may be used in forming the active layer 28 may include InGaAs, GaAs, AlGaAs, AlGaInP, InGap, InGaAsp, AlGaAsP, or InAlGaAs.

The cladding layers 30 preferably have an energy bandgap that is larger than the energy bandgap of the active layer 28. Furthermore, the cladding layers 30 may have a semiconductor alloy composition that is uniform in the growth direction, forming a separate confinement heterostructure (SCH) active region 18. Alternately, the semiconductor alloy composition of the cladding layers 30 may be graded in the growth direction (i.e. graded from a higher-bandgap to a lower-bandgap alloy composition for the first-grown cladding layer, and graded from a lower-bandgap alloy to a higher-bandgap composition for the second-grown cladding layer), forming a graded-index separate confinement heterostructure (GRIN-SCH) active region 18.

The first-grown cladding layer 30 in FIG. 1 preferably has a doping type that is the same as the adjacent first DBR mirror (e.g. n-type doped to about $5\times10^{17}$ cm$^{-3}$ with Si); and the second-grown cladding layer 30 is preferably doped oppositely (e.g. p-type doped to about $5\times10^{17}$ cm$^{-3}$ with C) to form a semiconductor p-n or p-i-n junction across the active region 18. The active layer 28 is preferably undoped (i.e. unintentionally doped or intrinsic).

The second DBR mirror 16 is epitaxially grown above the active region 18 and preferably has a doping type opposite that of the first DBR mirror 14 (e.g. p-type doped with C to about $10^{18}$ cm$^{-3}$). The second DBR mirror also comprises at least one pair of semiconductor layers (each pair including a first layer 32 and a second layer 34), with each layer in the pair being substantially one-quarter-wavelength thick (or an odd multiple thereof), and having a different index of refraction to provide for reflection of light at the wavelength of operation of the device 10. The first few pairs of semiconductor layers of each DBR mirror nearest to the active region 18 may be grown with a reduced doping concentration as compared to the remaining pairs of layers to reduce an optical loss in the resonant cavity due to dopant impurity absorption and scattering. In one or more of the uppermost pairs of semiconductor layers of the second DBR mirror 16, the doping concentration may be increased to about $10^{19}$ cm$^{-3}$ or more to facilitate electrically contacting the second DBR mirror 16 with a deposited upper electrode 20. The first and second DBR mirrors, 14 and 16 respectively, will be described in greater detail hereinafter, particularly with regard to a heterojunction formed between any two adjacent layers (32 and 34) in each DBR mirror.

The upper electrode 20 is preferably deposited after patterning the second DBR mirror 16 and forming an annular current-blocking region 24 thereabout as known to the art. The current blocking region 24 may be formed, for example, by etching down at least part way through the second DBR mirror 16 to leave a central portion thereof centered about the axis 26 of the device 10. After patterning the second DBR mirror 16, an insulating or high resistivity layer such as a polyimide, a regrown semiconductor layer (e.g. having a doping type opposite that of the DBR mirror 16), or the like may be grown, deposited or spun onto the semiconductor wafer. As another example, the current blocking region 24 may be formed by implanting high-energy ions such as hydrogen or oxygen ions outside the central portion of the second DBR mirror 16 to increase an electrical resistivity outside the central portion.

Figure 2:
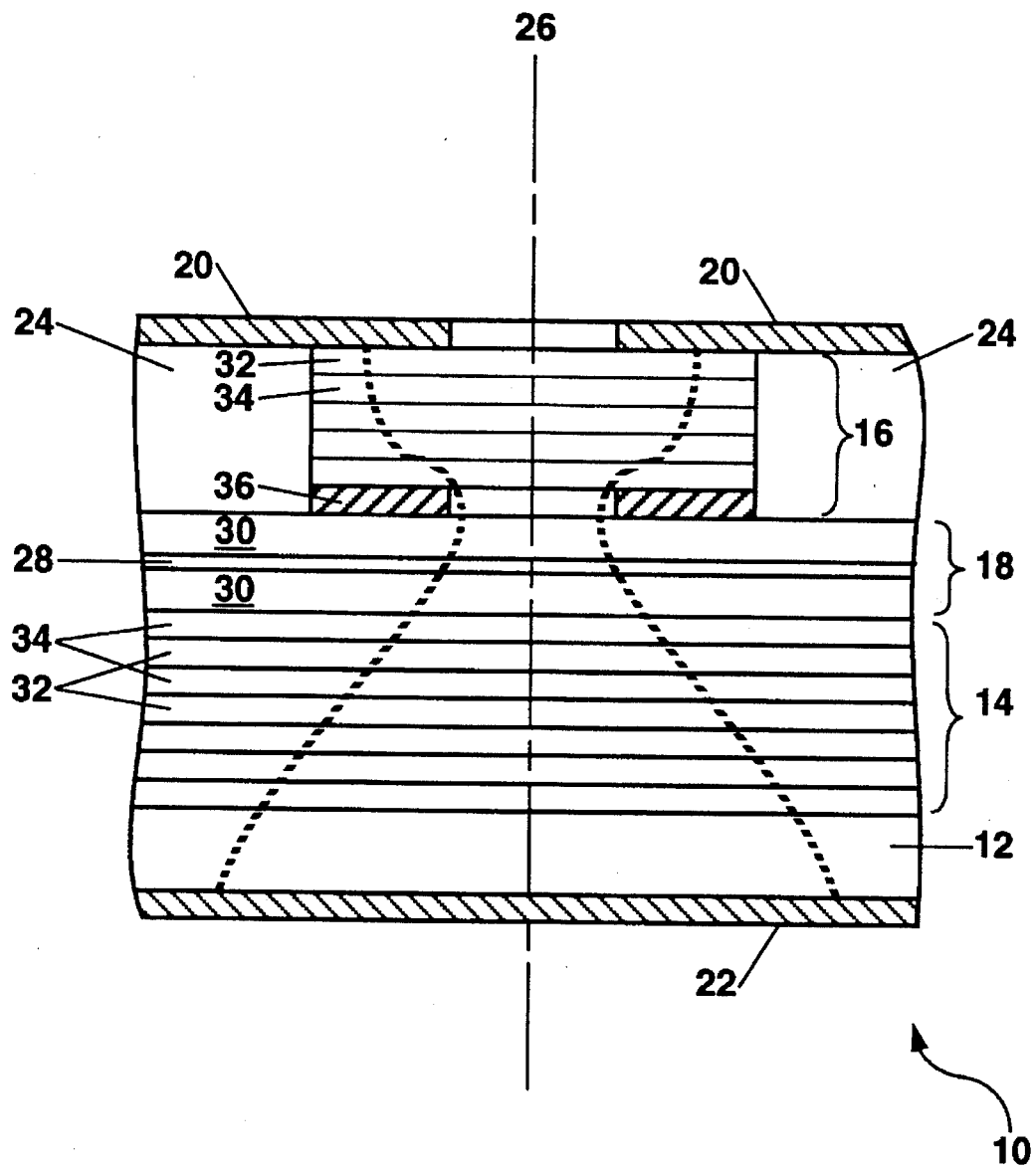
FIG. 2 shows a schematic diagram of a second embodiment of an optical device according to the present invention.

As yet another example, the current blocking region 24 may comprise one or more layers of the second DBR mirror that have been altered by a chemical process to increase the electrical resistivity therein. Such chemical alteration may include, for example, an oxidation process whereby one or more AlGaAs semiconductor layers 34 of a second DBR mirror 16 are chemically converted to an oxide of aluminum. This oxidation process may be performed by etching downward at least partially through the second DBR mirror 16 to expose one or more AlGaAs layers 34, and then exposing the AlGaAs layers to a moist environment (e.g. a flow of nitrogen gas bubbled through water at about 95° C. to entrain moisture therein) with the semiconductor wafer maintained at an elevated temperature of about 350°–500° C. for a time sufficient for an annular portion of the AlGaAs layers outside the central region of the second DBR mirror to be converted to an oxide of aluminum. The oxidation rate of one or more AlGaAs layers 34 of the second DBR mirror may be selectively controlled by controlling the composition of the AlGaAs layers, with the oxidation rate being highest when the aluminum composition, x, in an $Al_xGa_{1-x}As$ layer is greatest. Thus, one or more $Al_xGa_{1-x}As$ layers 34 in the second DBR mirror may have an aluminum composition, x, higher than the remaining $Al_xGa_{1-x}As$ layers in the mirror for forming a current-blocking region 24 that extends inward into the central portion of the second DBR mirror (preferably close to the active region 18) as shown in FIG. 2.

The above examples for forming a current blocking region 24 may be used either singly or in combination for forming the optical device 10 according to the present invention.

Figure 3:
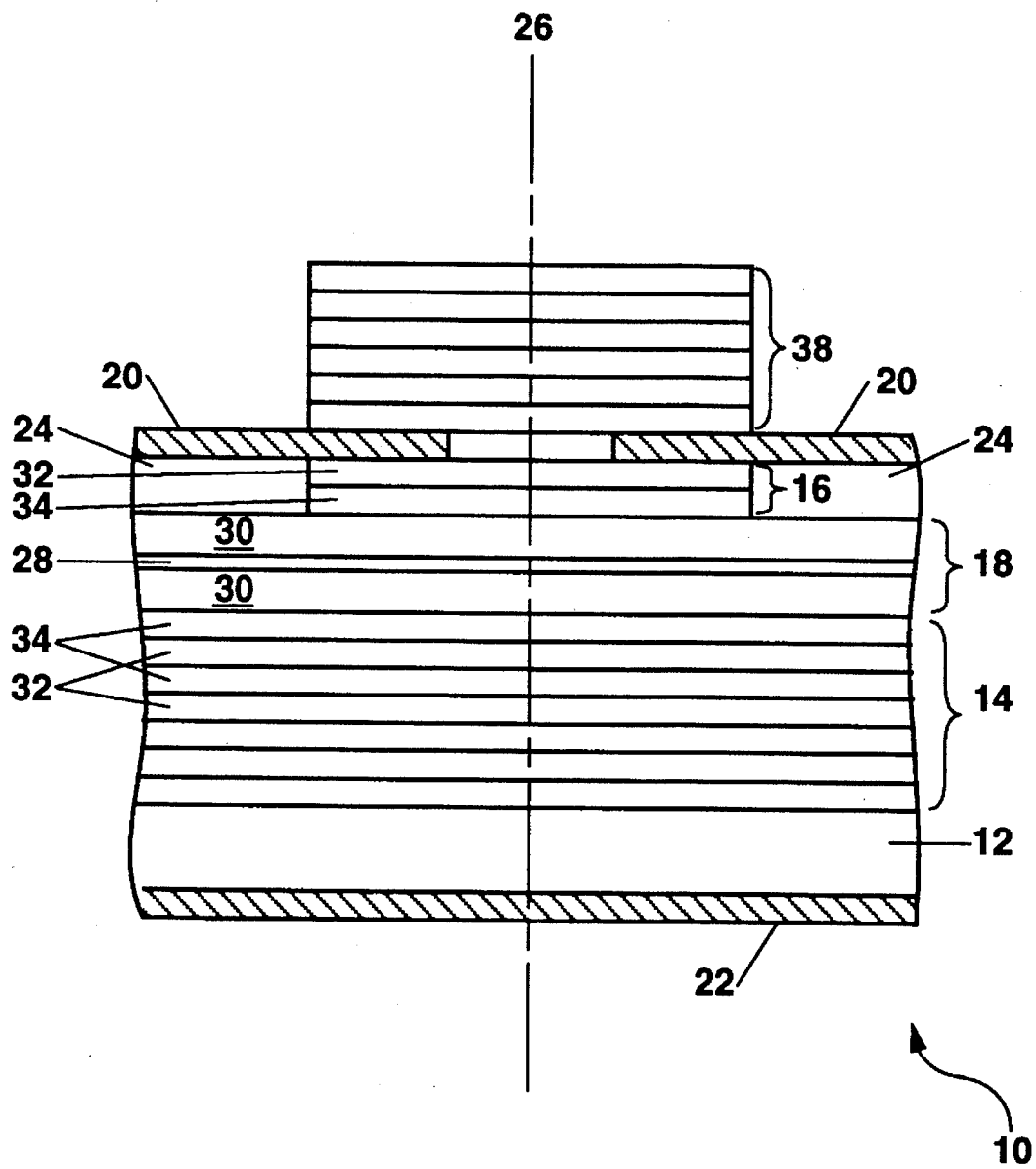
FIG. 3 shows a schematic diagram of a third embodiment of an optical device according to the present invention.

To electrically contact the optical device 10, upper and lower electrodes are preferably deposited above the second DBR mirror 16 and below the substrate 12, respectively. The upper and lower electrodes (20 and 22, respectively) may be formed from an opaque metallization (i.e. optically thick), a semi-transparent metallization (for example, indium-tin-oxide), or a metallization patterned to define a central opening for transmission of light therethrough. The particular type of metallization for each electrode will depend upon the vertical direction in which light is to be generated or detected. If the light is to be emitted or received from the top of the device 10 as shown in FIGS. 1–3, then a semi-transparent or patterned metallization is preferred for the upper electrode 20; and the lower electrode 22 may be an opaque metallization. Alternately, if the light is to be emitted or received through the bottom of the device (i.e. through a transparent semiconductor substrate 12), then the lower electrode 22 preferably comprises a semi-transparent or patterned metallization; and the upper electrode 20 may be an opaque metallization.

The upper electrode 22 may be deposited before or after formation of the current blocking region 24. If the upper electrode 22 is deposited before the formation of the current blocking region 24 by an etching, ion implantation or selective oxidation step, the upper electrode may either be protected by an overlying deposited and patterned mask layer; or the upper electrode may form at least a part of the mask layer.

In the first embodiment of the present invention shown in FIG. 1, the upper electrode 20 may be formed, for example, by depositing a AuBe/Ti/Au metallization with a thickness of about 150 nm or more above a p-type second DBR mirror 16, and defining the central opening therein by a lithographic masking and lift-off process. Likewise, in FIG. 1, the lower electrode 22 may be formed, for example, by depositing a AuGe/Ni/Au patterned or full-surface metallization on the lower surface of an n-type substrate 12. (If the doping types of the substrate and second DBR mirror are reversed in the above example, the above compositions of the electrode metallizations would also be reversed.) After deposition, the metallizations are annealed, forming electrical contacts to the optical device 10.

The central opening in a patterned upper electrode 20 is generally sized to be about the same or smaller in diameter than the central portion of the second DBR mirror 16 so that light may be coupled into or out from the optical device 10 through the central opening while allowing an operating voltage (i.e. a bias voltage) to be applied across the upper and lower electrodes (20 and 22, respectively) for biasing the active region 18 of the device 10. The optical device 10 may be mounted on a heat sink with the substrate 12, for example, positioned in contact with the heat sink and attached thereto.

By forward-biasing a semiconductor junction in the active region 18 light may be generated therein, forming a VCSEL, RCLED, or LED device 10 depending upon a forward-bias current, and the reflectivity of the DBR mirrors in the device.

Alternately, if the semiconductor junction in the active region 18 is reverse-biased a RCPD device 10 may be formed for sensing or detecting a light beam received into the junction and generating a photocurrent.

FIG. 2 shows a second embodiment of the optical device 10 according to the present invention that is particularly well suited for forming efficient light-emitting devices such as VCSELs and RCLEDs, and for electrically isolating a plurality of light-emitting devices 10 formed as a one-dimensional or two-dimensional array on a wafer. One or more RCPDs may also be formed according to the second embodiment of the present invention with improved electrical isolation, including one-dimensional and two-dimensional photodetector arrays.

This second embodiment of the present invention is fabricated in a manner similar to that of the first embodiment described heretofore. In the second embodiment of the invention in FIG. 2, the second DBR mirror 16 preferably comprises alternating high-refractive-index semiconductor layers 32 formed of $Al_xGa_{1-x}As$ with a low value of x (including x=0) and low-refractive-index semiconductor layers 34 (i.e. higher-bandgap second layers) also formed of $Al_xGa_{1-x}As$, but with a value of x higher than the layers 32 (including x=1). One or more of the low-refractive-index semiconductor layers 34 may have an aluminum composition, x, higher than the remaining low-refractive-index semiconductor layers in the mirror for the formation of current-blocking layers 36 as shown in FIG. 2.

A selective oxidation process as described heretofore may then be used to selectively oxidize the low-refractive-index semiconductor layers 34 to convert an annular outer portion of the layers into an oxide of aluminum that is highly resistive or insulating, with an inward lateral extent of oxidation (beginning at an exposed outer sidewall of the semiconductor layers 34) depending nonlinearly on the aluminum composition, x, in the layers 34. Thus, any of the low-refractive-index semiconductor layers 34 having even a slight increase of a few percent or more in the aluminum composition, x, compared to the remaining layers will have a much larger inward lateral extent of oxidation, thereby forming the current-blocking layer 36 (considered herein to be a part of the current-blocking region 24) extending inward into the second DBR mirror 16 as shown in FIG. 2. The high-refractive-index layers 32 have an aluminum composition, x, that is lower than any of the low-refractive-index layers 34 so that the high-refractive-index layers will be affected to a much smaller extent by the selective oxidation process.

One or more current-blocking layers 36 are preferably formed close to the active region 18 for effectively channeling an electrical current (shown as the dashed lines in FIG. 2) into the active region 18 for increasing an efficiency for light generation therein. If the current blocking region 24 extends downward through the active region 18 and into the first DBR mirror 14, then one or more current-blocking layers 36 may be formed on either side of the active region, or on both sides thereof. The use of one or more current-blocking layers 36 in the current-blocking region 24 according to the second embodiment of the invention may improve device efficiency and performance over that possible with an ion-implanted current-blocking region having no current-blocking layers 36.

FIG. 3 shows a third embodiment of the optical device 10 according to the present invention. In FIG. 3, the optical device 10 is formed in a manner similar to the first or second embodiments described heretofore, except for a third mirror 38 that overlies the second DBR mirror 16.

In FIG. 3, the second DBR mirror 16 preferably comprises only a few (e.g. from one to about ten) pairs of semiconductor layers (32 and 34). The semiconductor layers (32 and 34) in the second DBR mirror for this embodiment of the present invention serve largely to couple an electrical current into or out from the device 10, while still providing some reflectivity. By designing a heterojunction between any two layers (32 and 34) of the second DBR mirror as described hereinafter, a lateral electrical resistance of the mirror may be substantially reduced thereby enhancing the flow of the electrical current into or out from the device 10.

According to the third embodiment of the present invention, an LED device 10 may be formed by omitting the third mirror 38; or a VCSEL, RCLED, or RCPD device 10 may be formed by adding the third mirror 38 as shown in FIG. 3.

The third mirror 38 preferably comprises a plurality of alternating low-refractive-index and high-refractive-index dielectric layers deposited above the second DBR mirror and at least partially overlying the upper electrode 20. The dielectric layers are substantially one-quarter wavelength thick (or an odd multiple thereof) for forming a DBR mirror with a reflection that is additive to the reflection of the second DBR mirror. For this purpose, a phase-matching semiconductor layer (including a heavily doped cap layer) may be interposed between the second DBR mirror 16 and the third mirror 38 in some embodiments of the present invention.

An advantage of forming an optical device 10 according to the third embodiment of the invention is that a reflectivity and/or a center wavelength (i.e. a wavelength about which a reflectivity curve of the third mirror is centered which preferably corresponds to a gain peak in the active region 18) of the third mirror 38 may be determined after epitaxial growth of the semiconductor layers (32 and 34) and a characterization thereof (e.g. a measurement the gain peak and/or a reflectivity curve of the first DBR mirror 14). Another advantage of the third embodiment of the present invention is that a series electrical resistance in the device may be reduced by providing an upper electrode 20 that is close to the active region 18, with the electrical current passing through only a very few semiconductor layers (32 and 34) before reaching the active region.

Yet another advantage of the third embodiment is that a plurality of optical devices 10 may be formed on a semiconductor wafer, with adjacent devices being of different types, defined at least in part by a selective deposition or patterning of the third mirror thereon. For example, LED devices 10 may be formed on one part of a wafer by omitting the third mirror 38; whereas VCSEL, RCLED, or RCPD devices 10 or combinations thereof may be formed on other parts of the same wafer by providing the third mirror. In some examples of the present invention according to the third embodiment thereof, the center wavelength of the third mirror 38 may be varied across at least a portion of the semiconductor wafer to provide a plurality of optical devices 10 having different operating wavelengths, for example, for frequency multiplexing or demultiplexing of optical signals from or to the device. Such a wafer may be used, for example, for forming optical interconnection devices for providing a plurality of one-or two-way channels of optical communication (e.g. through optical fibers or free space) for use in connecting integrated circuits, or for other applications in which one or more light beams are communicated between light-emitting devices 10 and light-detecting devices 10.

Figure 4:
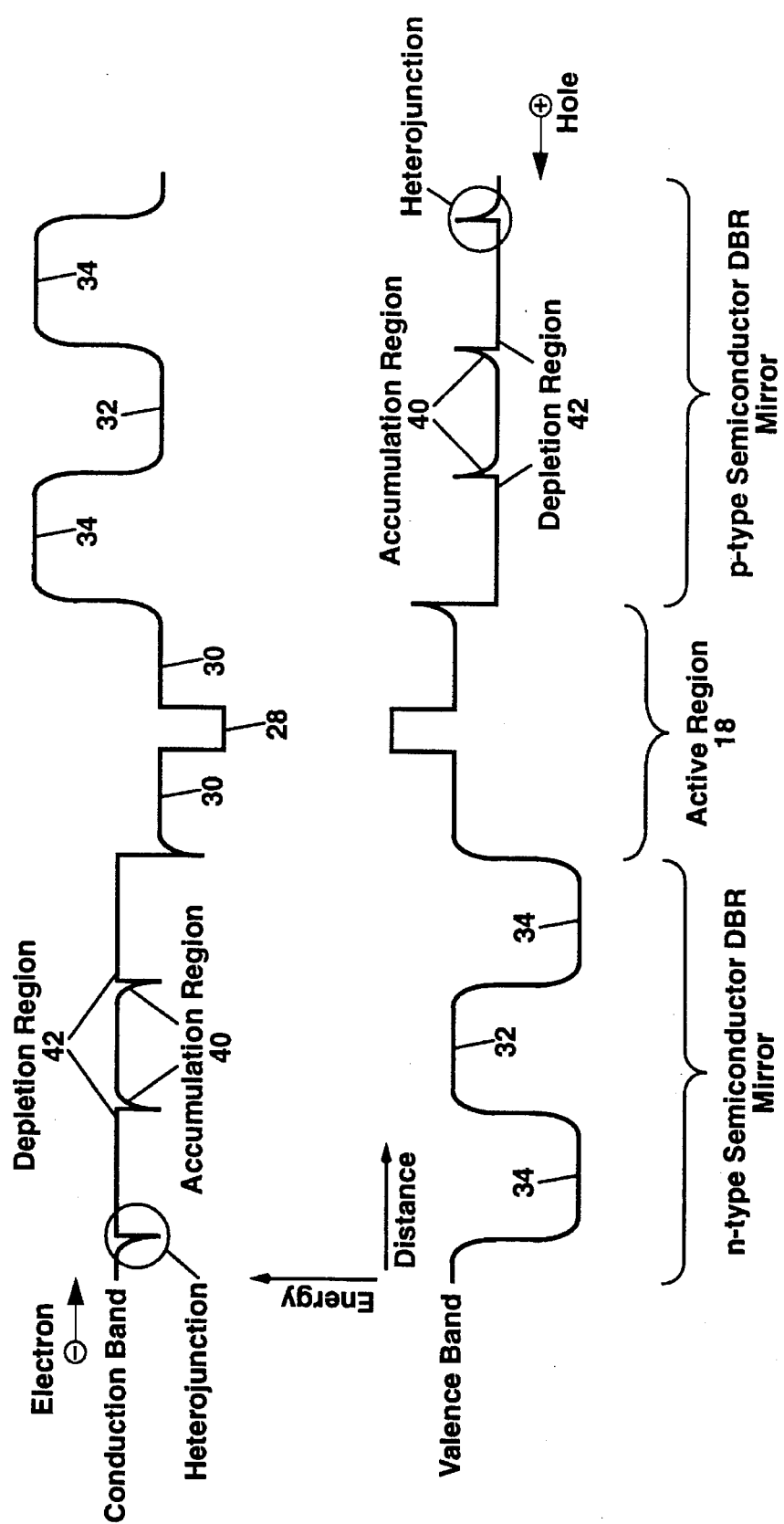
FIG. 4 schematically shows a partial energy band diagram for the optical device of the present invention.

FIG. 4 shows schematically a partial energy band diagram centered about the active region 18 of the optical device 10 of the present invention. In FIG. 4, a heterojunction formed between any two adjacent semiconductor layers of each of the DBR mirrors comprises an accumulation 40 (defined herein to be a first region on one side of a heterojunction between two different semiconductor layers wherein a plurality of carriers may be accumulated or localized within a potential energy well or trough) on one side of the heterojunction and a depletion region 42 (defined herein to be a second region on the other side of the heterojunction wherein a potential energy peak or barrier may be present, unless sufficiently suppressed, producing a local depletion of carriers and impeding carrier flow across the heterojunction) on the other side of the heterojunction. The accumulation region 40 is adjacent to a first layer 32 (i.e. the high-refractive-index semiconductor layer) having a first composition and a first bandgap; and the depletion region 42 is adjacent to a second layer 34 (i.e. the low-refractive-index semiconductor layer) having a second composition and a second bandgap, with the second bandgap being greater (i.e. having a higher bandgap energy) than the first bandgap. For example, the first layer 32 may be GaAs or $Al_xGa_{1-x}As$ with a low value of x, and the second layer 34 may be AlAs or $Al_xGa_{1-x}As$ with a value of x higher than the first layer.

According to the present invention, the depletion regions 42 are preferably smoothly varied in composition to substantially reduce any potential barriers therein for reducing a voltage drop and series electrical resistance within one or more DBR mirrors. However, the accumulation regions 40 on the opposite side of each heterojunction do not form potential barriers; but instead form potential troughs which may be readily filled to saturation with carriers (produced by a bias voltage applied across the device 10, or by photo-generation by an absorption of light in the active region 18), and therefore do not substantially impede the flow of an electrical current or contribute significantly to the voltage drop and series electrical resistance.

Furthermore, according to the teaching of the present invention, the accumulation regions 40 may be enhanced and an energy depth of the potential troughs increased, for example, by abruptly grading the composition of the accumulation region 40 between the first composition of the first semiconductor layer 32 and a third composition 44 (as shown in FIGS. 7a and 7b and FIGS. 10a and 10b intermediate between the first and second compositions. In this way, the accumulation regions 40 may be used to advantage for collecting electrons or holes and producing an enhanced lateral flow of the carriers (i.e. electrons or holes) for reducing a lateral electrical resistance within each DBR mirror. (A reduced thickness and alloy content in the accumulation regions 40 resulting from a rapid composition grading within the accumulation regions is also advantageous for reducing alloy scattering and thereby reducing a vertical electrical resistance and a thermal resistance in each DBR mirror.) For very thin accumulation regions 40 wherein a quantum confinement of the carriers may occur, a two-dimensional electron or hole gas may be formed thereby increasing a lateral mobility and flow of the carriers (i.e. electrons and holes) within each DBR mirror of the device 10.

Figure 5A:
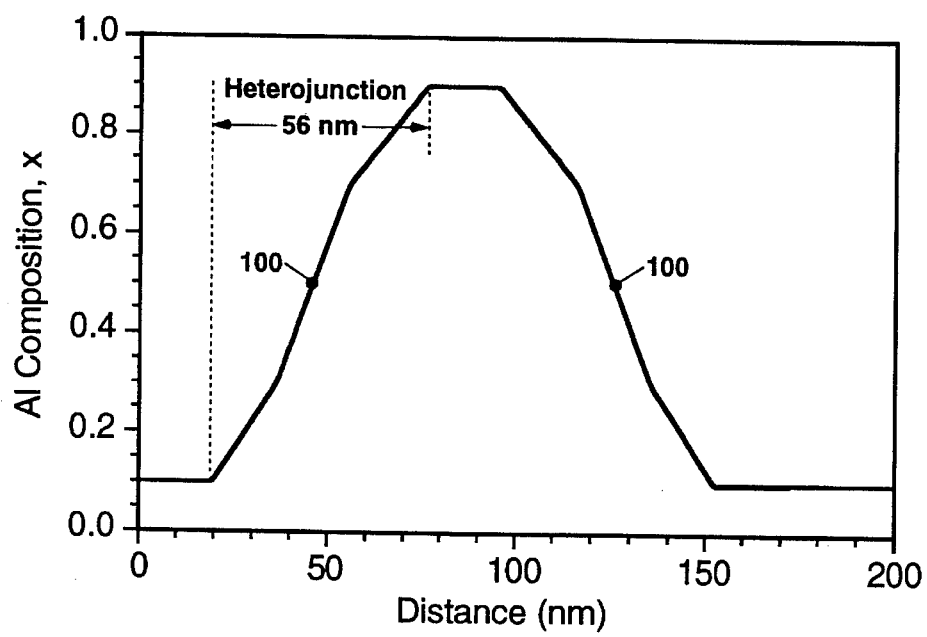
FIGS. 5a and 5b show the variation of aluminum composition, x, with distance in the growth direction and a calculated equilibrium valence band energy diagram, respectively, for a portion of a three-segment piecewise-linearly-graded p-type DBR mirror according to the prior art.
Figure 5B:
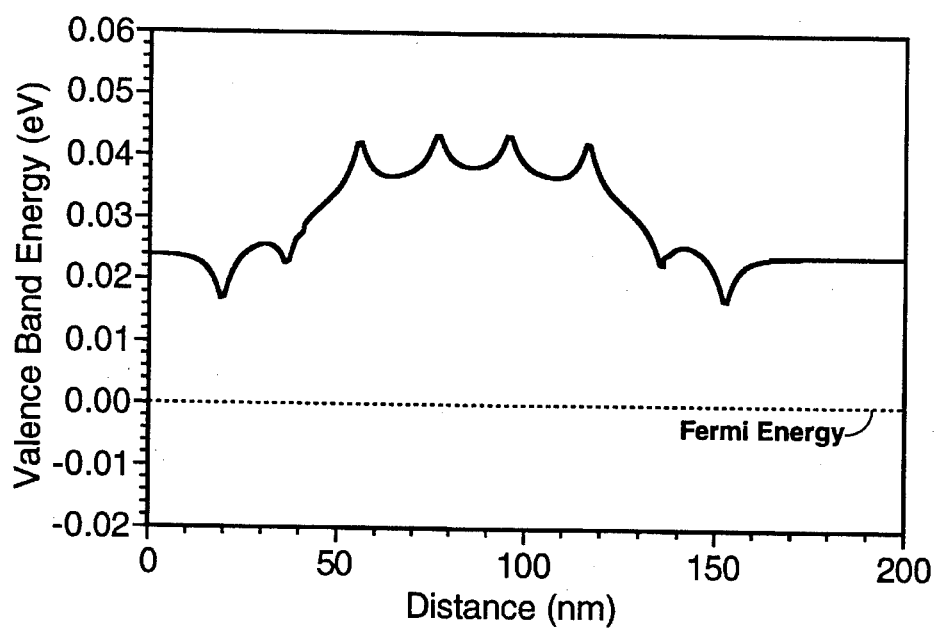
Figure 6A:
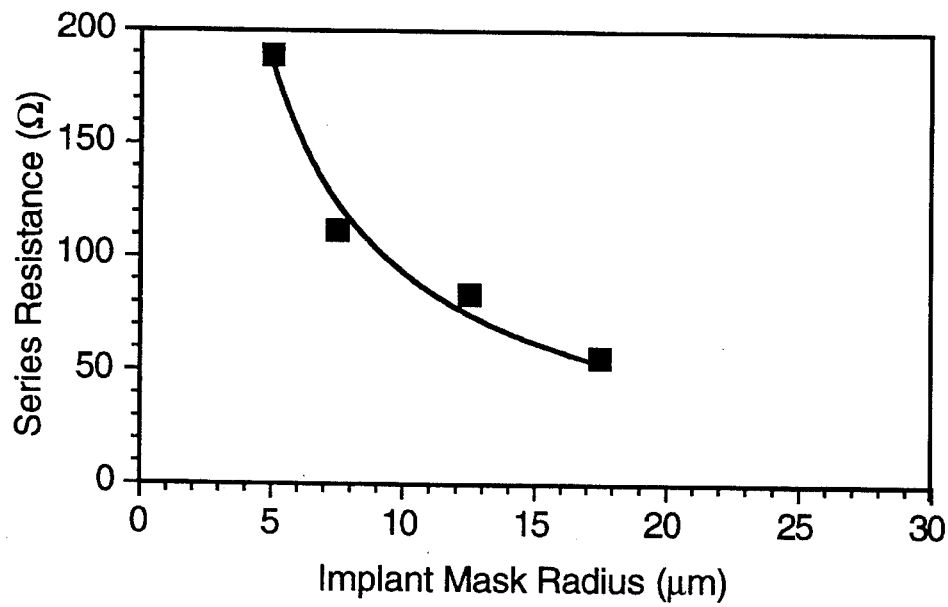
FIGS. 6a and 6b show the measured size dependence of the series electrical resistance and thermal resistance for VCSELs including the prior art three-segment piecewise-linearly-graded p-type DBR mirror of FIGS. 5a and 5b.
Figure 6B:
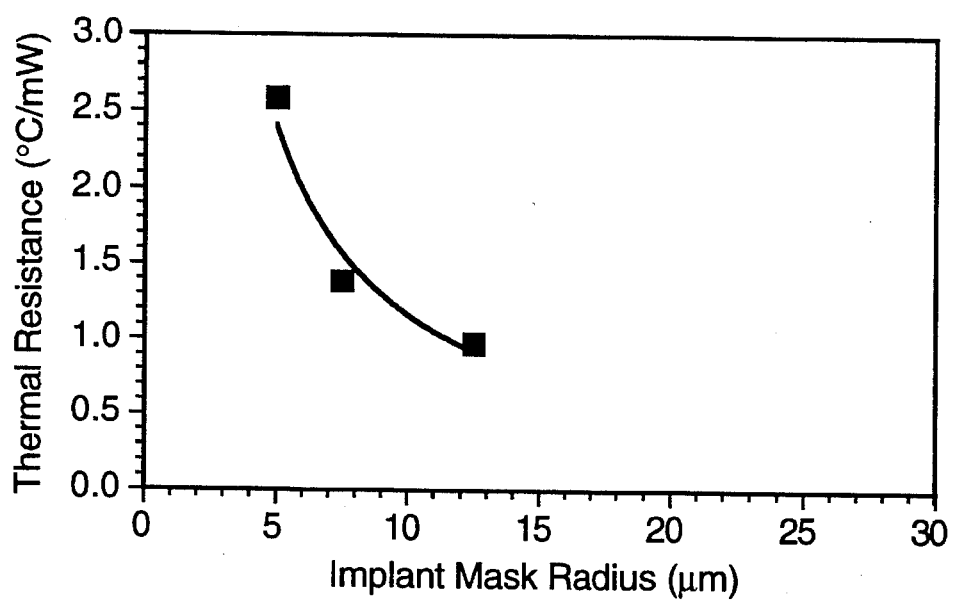

In order to more fully appreciate the advance of the present invention over the prior art, FIGS. 5a and 5b and FIGS. 6a and 6b are provided for comparison to show characteristics of a prior-art three-segment piecewise-linearly-graded p-type DBR mirror and VCSEL devices incorporating such a mirror as formed according to U.S. Pat. No. 5,379,719 to Chalmers et al which is incorporated herein by reference. The Chalmers et al patent discloses a prior art MBE growth method that uses temperature ramping of one or more source cells for forming three-segment piecewise-linearly-graded DBR mirror interfaces (i.e. heterojunctions) that represented an improvement over previous single-segment linearly-graded DBR mirror interfaces. FIGS. 5a and 5b shows the variation in composition between adjacent semiconductor layers in a portion of the prior-art DBR mirror and the resultant calculated equilibrium valence band energy band diagram. FIGS. 6a and 6b shows electrical and thermal resistances for VCSEL devices fabricated with the three-segment piecewise-linearly-graded heterojunctions of FIGS. 5a and 5b.

In FIG. 5a, the three-segment piecewise-linearly-graded heterojunctions are formed between ternary-alloy $Al_{0.1}Ga_{0.9}As$ semiconductor layers and $Al_{0.9}Ga_{0.1}As$ semiconductor layers due to a difficulty of grading the semiconductor layers to a binary-alloy composition (e.g. GaAs and AlAs) by MBE with temperature ramping. In the Chalmers et al patent only an MBE growth method is considered, with no mention or suggestion of any applicability of that prior-art invention to MOVCD.) Each piecewise-linearly-graded heterojunction in FIG. 5a is symmetrical about a point of inversion 100 located at a midpoint of the heterojunction, with the piecewise-linearly-graded region on each side of the heterojunction being identical in shape and size (i.e. thickness in the growth direction).

A period of the prior-art mirror of the Chalmers et al patent comprises alternating $Al_{0.1}Ga_{0.9}As$ and $Al_{0.9}Ga_{0.1}As$ semiconductor layers having a thickness of about one-quarter-wavelength at a design wavelength near 980 nm. However, as can be seen from FIG. 5a, a substantial portion of each semiconductor layer is given to formation of the piecewise-linearly-graded heterojunctions each of which is 56 nm thick. This large region of the semiconductor layers given over to the formation of each piecewise-linearly-graded heterojunction is disadvantageous since a reflectivity of each heterojunction is lowered from the reflectivity that would be obtained in the absence of any grading between the semiconductor layers. Furthermore, the ternary-alloy semiconductor layers in the prior-art DBR mirror of FIG. 5a have an interface reflectivity that is lower than that of binary-alloy semiconductor layers due to a smaller refractive index difference of the ternary-alloy layers. Another disadvantage of the large ternary-alloy piecewise-linearly-graded heterojunctions of the prior art is that alloy scattering within the heterojunctions reduces both an electronic mobility of carriers and a thermal mobility of phonons, adding to the series electrical resistance and the thermal resistance, respectively.

In FIG. 5a, the interface reflectivity (i.e. a field reflection coefficient) for each pair of adjacent semiconductor layers was calculated to be 0.057, with 33 pairs of semiconductor layers being required to form a high-reflectivity n-type DBR mirror, and 22 pairs of semiconductor layers being required to form a p-type DBR output coupling mirror. The reflectivity of the n-type DBR mirror was lower than desired, having a non-neglible transmission loss. This was due to growth time constraints arising from the slow growth rate of only about 1 μm/hour for MBE which limited the number of pairs of semiconductor layers in the prior-art n-type DBR mirror to the above value.

FIG. 5b shows a calculated equilibrium valence band energy diagram referenced to the Fermi Energy (taken as the "zero" energy in FIG. 5b) for the prior-art VCSEL device of FIG. 5a. In FIG. 5b (and also in FIG. 7b), the equilibrium valence band energy diagram is inverted from the convention of FIG. 4 so that the hole energy is increasing in the upward direction with any potential barriers to hole flow appearing as peaks in the equilibrium valence band energy diagram. In FIG. 5b, the changes in slope of the graded heterojunction produce a series of upward and downward pointing potential cusps, with a calculated maximum potential barrier energy of about 43 meV.

Operating data for prior-art VCSELs fabricated according to the Chalmers et al patent are disclosed in an article by K. L. Lear, S. P. Kilcoyne, and S. A. Chalmers entitled *"High Power Conversion Efficiencies and Scaling Issues for Multimode Vertical-Cavity Top-Surface-Emitting Lasers,"* published in IEEE Photonics Technology Letters, volume 6, pages 778–781, July 1994.

FIGS. 6a and 6b show the measured size dependence of the series electrical resistance and thermal resistance for VCSELs including the prior an three-segment piecewise-linearly-graded p-type DBR mirror of FIGS. 5a and 5b. In FIG. 6a, the series electrical resistance as measured from a linear fit of the current versus voltage curves between a lasing threshold point and a maximum operating power point are plotted for various gain region radii (as determined by ion implantation), r, between 5 and 17.5 μm. The data in FIG. 5a were fitted to an equation for the series electrical resistance, $R_s$, given by:

$$R_S = \frac{R_L}{r} + \frac{R_V}{(\pi r^2)}$$

where $R_L = 0.066$ Ω-cm and $R_V = 2.6 \times 10^{-5}$ Ω-cm$^2$ are fitting parameters for the lateral and vertical electrical resistances, respectively. (The curve fits to the above equation are shown as solid lines in FIGS. 6a and 8a.) In the above equation, the first term accounts for lateral, contact, and constriction (due to current constriction or spreading in the substrate) electrical resistances that scale inversely with the radius of the gain region; and the second term corresponds to a uniform vertical current flow electrical resistance that scales inversely with a circular area ($\pi r^2$) of the gain region. By fitting the electrical resistance data of FIG. 5a to the above equation, it was determined that the 1/r term (representing lateral, contact, and constriction electrical resistances) was dominant for all the devices studied. However, no means were known or disclosed in the prior art for reducing these electrical resistances. A reduction in the lateral electrical resistance is especially important for improving the efficiency and performance of VCSELs having a central opening in an upper electrode, since the electrical current in such devices must flow, at least in part, in a lateral direction to reach an active region therein.

The prior art VCSEL devices of FIGS. 5a and 5b and FIGS. 6a and 6b showed a highest electrical-to-optical energy conversion efficiency for intermediate size devices with 7.5 μm radius, with the efficiency being reduced for larger size devices. The maximum reported electrical-to-optical efficiency for these prior art VCSEL devices was 15.8% for a 7.5 μm-radius VCSEL operating at about 10 mA current; and the maximum light output power for this prior art device was about 5.5 mW obtained at about 16 mA current just before thermal rollover (i.e. a decreasing light output power with increasing current) occurred due to excessive heating within the device.

FIGS. 7a and 7b and FIGS. 8a and 8b show characteristics of a first example of an asymmetrically-graded heterojunction p-type DBR mirror and measured electrical and thermal resistances of a VCSEL device 10 incorporating such a DBR mirror according to the present invention, respectively. Although the discussion hereinafter will be limited to a p-type DBR mirror (e.g. a second mirror 16), it will be evident to those skilled in the art that an n-type DBR mirror (e.g. a first mirror 14) may be formed in a similar manner. It should also be noted that the VCSEL device 10 described hereinafter includes both n-type and p-type DBR mirrors formed according to the first embodiment of the present invention as shown in FIG. 1.

Figure 7A:
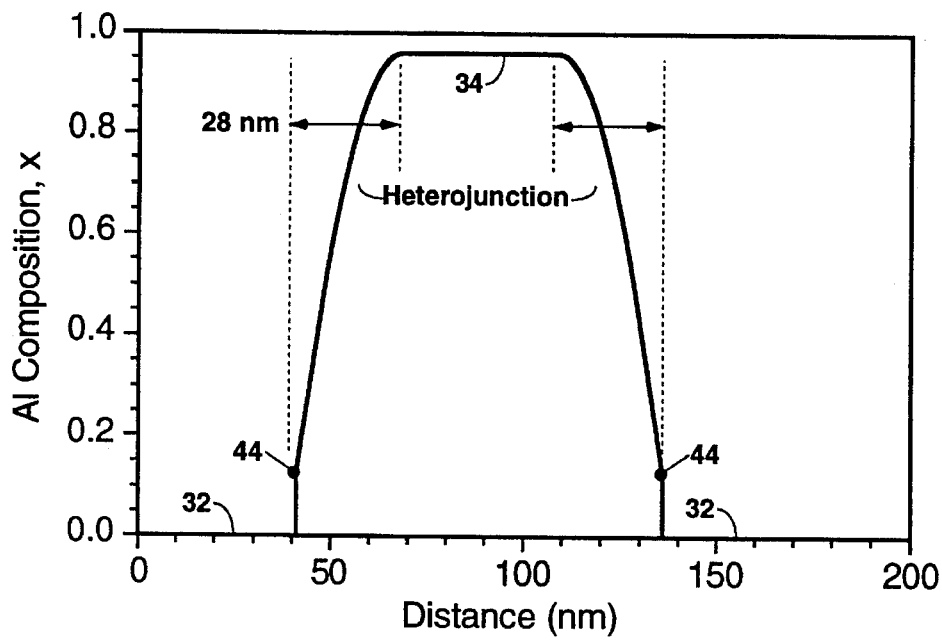
FIGS. 7a and 7b show the variation of aluminum composition, x, with distance in the growth direction and a calculated equilibrium valence band energy diagram, respectively for a portion of a first example of a p-type DBR mirror according to the present invention.
Figure 7B:
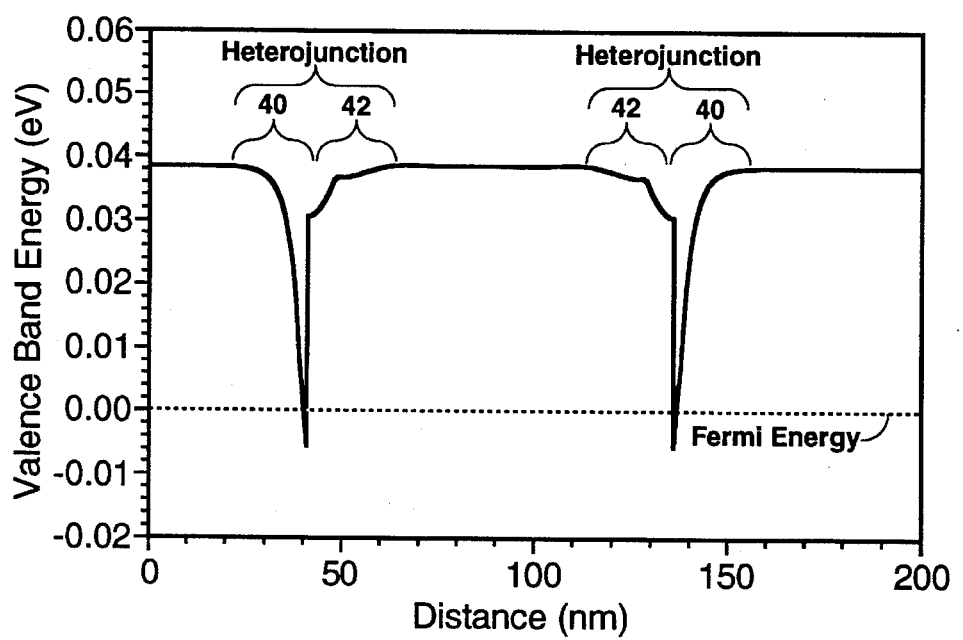

FIGS. 7a and 7b show the variation of aluminum composition, x, with distance in the growth direction and a calculated equilibrium valence band energy diagram, respectively for a portion of a first example of an asymmetrically-graded p-type DBR mirror according to the present invention. In FIG. 7a, a composition curve is presented showing the variation in the aluminum composition, x, of $Al_xGa_{1-x}As$ semiconductor layers (32 and 34). The first layers 32 (i.e. the high-refractive-index layers) in this first example of the invention are binary-alloy layers of GaAs; and the second layers 34 (i.e. the low-refractive-index layers) are ternary-alloy layers of $Al_{0.96}Ga_{0.04}As$, with the semiconductor layers being grown by MOCVD. (The semiconductor layers may also be grown by MBE with temperature ramping, although MOCVD may be preferred for manufacturing due to a higher growth rate that is about three times higher than that for MBE.)

In FIG. 7a, each heterojunction comprises an accumulation region 40 on one side of the heterojunction adjacent to the first layer 32 that is composition graded from the first composition to a third composition 44 which is intermediate between the first and second compositions. In this first example of the present invention, the third composition 44 is $Al_{0.1}Ga_{0.9}As$; and the composition in the accumulation region 40 is abruptly varied over a distance or thickness in the growth direction that is smaller than one-half of the width of the heterojunction (and therefore smaller than the thickness of the depletion region 42), thereby producing a graded heterojunction that is asymmetric about a midpoint of the heterojunction.

An upward curvature in the aluminum composition, x, in the accumulation region 40 in FIG. 7a produces a potential energy trough as shown in FIG. 7b. The potential energy trough (with an energy depth of less than 2 kT) in the valence band becomes readily saturated with holes so that the hole flow is not substantially impaired.

Figure 10A:
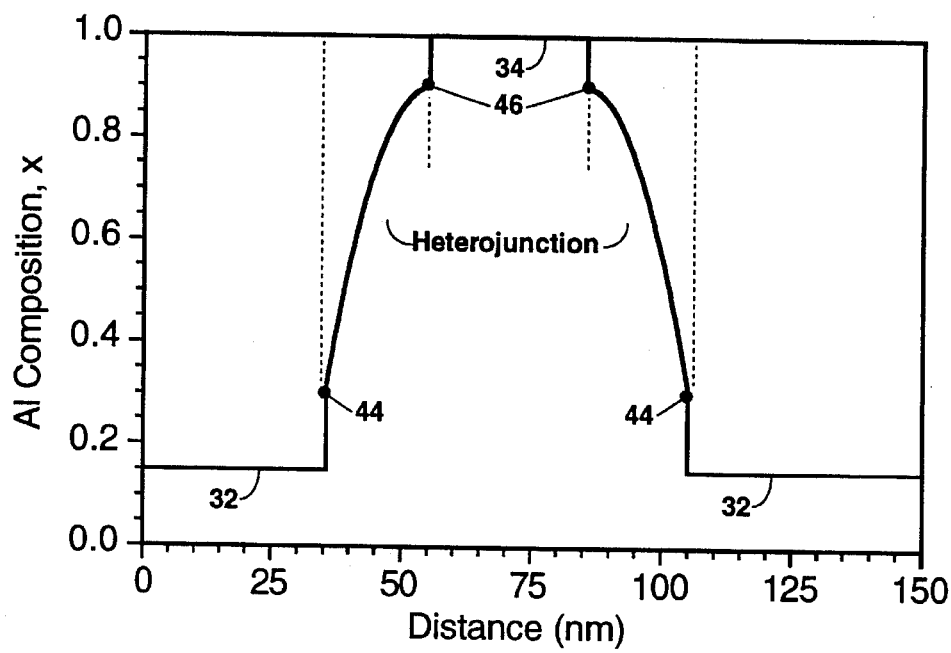
FIGS. 10a and 10b show the variation of aluminum composition, x, with distance in the growth direction and the ionized acceptor concentration with distance, respectively, for a portion of a second example of a p-type DBR mirror according to the present invention.

The composition grading in the accumulation region 40 curves upward from the first composition to third composition with a shape that is not critical; so that any upward-curving type of grading shape (including linear, piecewise linear, semiparabolic, and abrupt composition grading) may be used for growing the accumulation region of each heterojunction according to the present invention. An abrupt composition grading of the accumulation region 40 as shown in FIGS. 7a and 10a may be preferred for reducing a thickness of the accumulation region, or for producing a potential energy trough. In this way, the optical, electrical, and thermal properties of a DBR mirror may be enhanced. However, an energy depth of the trough should preferably be limited to a few thermal voltages (i.e. a few kT or less) to prevent the possibility of forming a potential energy barrier in the depletion region 42 due to a large space charge accumulated in the potential energy trough.

In FIG. 7a, a depletion region 42 on the opposite side of each heterojunction is formed by smoothly grading (e.g. semiparabolically grading) the composition from the third composition 44 to the second composition. Since the depletion region 42 may give rise to a potential energy barrier unless precautions are taken, the design of the depletion region is fairly critical, and preferably is smoothly graded to provide a downward curvature (i.e. a downward curving shape) in the composition in a direction approaching the higher-bandgap second layer 34 from each side thereof. The shape of the composition grading in the depletion region 42 may be semiparabolic as shown in FIG. 7a, or otherwise shaped to provide a downward curvature in composition when approaching the higher-bandgap second layer 34. The composition grading in the depletion region 42 in some embodiments of the present invention may comprise more than one composition-graded region, with the shape of a majority of the depletion region preferably having a downward curvature and including an upward curvature in a minority of the depletion region (as, for example, an abrupt upward curvature or increase in composition to a binary-alloy semiconductor layer 34 as shown in FIG. 10a).

According to the present invention, the depletion region 42 preferably has a smaller variation in composition with distance (i.e. a rate of grading) in the growth direction than the accumulation region. Furthermore, the composition grading in the depletion region 42 should be smoothly varying to prevent the formation of potential energy barriers in the depletion region 42 and to substantially flatten the energy band in the depletion region as shown in FIG. 7b. In FIG. 7b, the calculated equilibrium valence band energy diagram shows no depleted upward cusps or potential energy barriers to substantially inhibit carrier movement.

This flattening of the valence band in FIG. 7b is due to the shape of the depletion region, and also to an increased doping in the depletion region (i.e. modulation doping wherein the doping concentration is locally increased relative to an average doping concentration of the semiconductor layers) that provides a space charge therein for balancing a charge in the accumulation region 40 due to carriers localized in the potential energy trough. In the p-type DBR mirror of FIGS. 7a and 7b, the first and second semiconductor layers (32 and 34, respectively) and the accumulation region 40 are doped to a concentration of about $2 \times 10^{18}$ cm$^{-3}$ with carbon; and the depletion region 42 is doped with carbon to about $2.6 \times 10^{18}$ cm$^{-3}$.

According to the teaching of the present invention, the depletion region 42 should preferably be grown so that a rate of change in the composition (i.e. a slope in the composition curve as shown, for example, in FIG. 7a) in the depletion region is smaller near each side of each high-bandgap second layer 34; and the rate of change in the composition preferably increases with distance on both sides of each high-bandgap second layer 34. Another way of stating this is that the composition in the depletion region 42 in contact with each high-bandgap second layer 34 should preferably have a rate of change in the variation of the composition with distance that is varied in a manner (e.g. semiparabolically) so as to provide a band curvature of an energy bandgap, E.g., proximate to each high-bandgap second layer 34 that satisfies the equation:

$$\frac{d^2E_g}{dz^2} \leq 0$$

where z is a distance from the second layer 34 approaching from either side thereof. If the above considerations are applied, the height in energy of any potential energy barriers formed in the depletion regions 42 may be minimized according to the present invention.

A further appreciation for the nature of the present invention may be gained by considering the relationship between an electronic charge and a rate of change in the variation of an energy bandgap with distance in the accumulation region 40 and the depletion region 42. The electronic charge must be provided to generate an electrostatic energy that compensates, at least in part, for the variation in the conduction or valence band offsets with distance at the heterojunction. (A change in the bandgap energy results in changes in both the valence band offset and the conduction band offset such that the sum of the two offsets equals a total change in the bandgap energy. These offsets am typically proportional to the change in the bandgap energy.)

In the depletion region 42, a net charge of a polarity opposite that of a majority carrier (i.e. electrons or holes) must be provided (e.g. by modulation doping) in the depletion region to make the band energy substantially constant (i.e. to flatten the energy band) to avoid an increased energy (i.e. a potential barrier) from being formed therein. The magnitude of this charge, provided by an increased doping in the depletion region (i.e. modulation doping), is approximately proportional to the rate of change in the variation of the bandgap energy with distance (i.e. the second derivative of the bandgap energy, $E_g$, with respect to distance z in the heterojunction). The increased doping in the depletion region 42 is preferably limited to a few times the average doping in the semiconductor layers (32 and 34) to limit dopant diffusion and free-carrier absorption and scattering in the heterojunctions.

The above considerations are considerably relaxed for the accumulation region 40 since the net charge may be provided by a deviation of the bandgap energy therein in such a way that only potential troughs are generated which do not substantially inhibit carrier flow. Thus an absolute magnitude or value of the rate of change in the variation of the bandgap energy with distance given by:

$$\left| \frac{d^2 E_g}{dz^2} \right|$$

may be considerably larger in the accumulation region 40 than in the depletion region 42. In the case of an abruptly-graded accumulation region 40, the absolute magnitude of the second derivative above may be very large, allowing the thickness of the accumulation region to be greatly reduced. Thus, according to the present invention, it is preferable to make the above absolute magnitude of the second derivative of the bandgap energy with distance in the growth direction smaller in the depletion region 42 (i.e. the second region) than in the accumulation region 40 (i.e. the first region).

The accumulation regions 40 on the side of each heterojunction adjacent to the first layers 32 have been found to be less detrimental to carrier flow than the depletion regions 42. The accumulation regions 40 give rise to potential energy troughs (as shown, for example, in FIG. 7b) that may easily be saturated by filling up with electrons or holes so that the troughs do not significantly impair or inhibit the flow of the electrons or holes. The carriers that accumulate in the potential energy troughs typically form a two-dimensional electron or hole gas that enhances a lateral flow of the carders along a plane of the semiconductor layers 32 and 34, thereby reducing a lateral electrical resistance of the DBR mirror. This effect may be further used to advantage with an energy depth in the potential energy troughs increased (and hence the lateral flow of carriers) by increasing the rate of change in the composition in the accumulation regions 40 (e.g. by abruptly varying the composition as shown in FIG. 7a).

Thus, according to the present invention, the variation in composition in the accumulation regions 40 is of a lesser importance as compared to the variation in composition in the depletion regions 42 about each heterojunction in the DBR mirrors. As a result of this discovery, a thickness in the growth of the accumulation regions 40 may be substantially reduced while simultaneously providing a beneficial effect for the optical, electrical, and thermal properties of the semiconductor layers forming the DBR mirror, and for an optical device 10 incorporating one or more such DBR mirrors. The beneficial effect for the optical properties is an increased reflectivity due to a more abrupt transition between the high-refractive-index and low-refractive-index semiconductor layers (32 and 34, respectively); whereas the beneficial effect for the electrical and thermal properties is due, at least in part, to the reduced alloy content within the mirror that reduces alloy scattering, thereby reducing the vertical electrical resistance and the thermal resistance in each DBR mirror. These beneficial effects and the improvement over the prior art are further shown by experimental data and theoretical calculations for a VCSEL device formed according to the teaching of the present invention.

The VCSEL device 10 has a design for the semiconductor layers (32 and 34) as shown in FIG. 7a for operation at a wavelength of about 950 nm; and with each asymmetrically-graded heterojunction having a thickness of about 28 nm. (Other embodiments of the present invention may have even thinner asymmetrically-graded heterojunctions, with thicknesses down to about 10 nm.) The epitaxial device structure includes a 38-pair n-type first DBR mirror 14 and a triple InGaAs quantum-well active region 18 that is one-wavelength thick and includes composition-graded AlGaAs cladding layers 30. VCSEL devices 10 were fabricated in which the p-type second DBR mirror 16 comprised either 18 or 22 pairs of semiconductor layers (32 and 34).

The use of MOCVD for growth of the semiconductor layers at a growth rate, for example, of about 3 μm/hour permits a larger number of pairs of layers to be grown for the first DBR mirror 14, thereby increasing the mirror reflectivity and permitting a smaller number of pairs of semiconductor layers (32 and 34) to be grown for the second DBR mirror 16 for increasing a light output power and a slope efficiency (i.e. a change in light output power with current) of a light-emitting device 10 such as a VCSEL, RCLED, or LED. In addition, the reduction in the heterojunction thickness by about one-half or less as compared with the prior-art device of FIGS. 5a and 5b and FIGS. 6a and 6b the larger refractive index difference between the semiconductor layers 32 and 34 in the VCSEL device of the present invention increased the calculated interface reflectivity for each pair of semiconductor layers to about 0.078.

The VCSEL device 10 was grown by MOCVD on a GaAs substrate 12 that was misoriented from the (100) plane by 6° toward the <111>A direction. Triethylgallium (TEGa), trimethylaluminum (TMAl), trimethylindium (TMIn), and arsine ($ASH_3$) sources were used along with $Si_2H_6$ and $CCl_4$ as doping sources at a substrate temperature of about 750° C. for epitaxial growth of the device 10. The n-type first DBR mirror was Si-doped to an average doping concentration of about $2 \times 10^{18}$ $cm^{-3}$; while the p-type second DBR mirror was C-doped with an average doping concentration of about $1 \times 10^{18}$ $cm^{-3}$ for the first three pairs of semiconductor layers (32 and 34) adjacent to the active region 18, and with an average doping concentration of about $2 \times 10^{18}$ $cm^{-3}$ for the remaining pairs of semiconductor layers therein. A heavily-doped $p^+$ GaAs cap layer (having a thickness of about one-quarter-wavelength or an odd multiple thereof) with a doping concentration of $\geq 5 \times 10^{19}$ $cm^{-3}$ C was grown above the second DBR mirror 16 for forming an Ohmic contact with the upper electrode 20.

Top-emitting VCSEL devices 10 were fabricated as previously described with reference to FIG. 1. The upper electrode 20 was patterned to lateral dimensions of about 100 μm×100 μm with a 2.5- to 25 μm-radius central opening therethrough for transmission of lasing light. A thick photoresist mask (about 11.5 μm thick) having a size approximately equal to that of the central opening was placed over the central opening of each device 10 prior to proton implantation (at an energy of about 310–370 keV) for forming the current-blocking region 24. Neighboring VCSEL devices 10 on the semiconductor wafer were electrically isolated by etching downward through the active region 18 outside the patterned upper electrode 20. To complete the devices, a lower electrode 22 was deposited below the substrate 12; and the upper and lower electrodes were annealed for about 30 seconds at a temperature of about 400° C. (This annealing step may also act to reduce ion implant damage near the upper electrode 20 and the active region 18.) The devices 10 were characterized in wafer form on a 20° C. temperature-controlled stage.

Figure 8A:
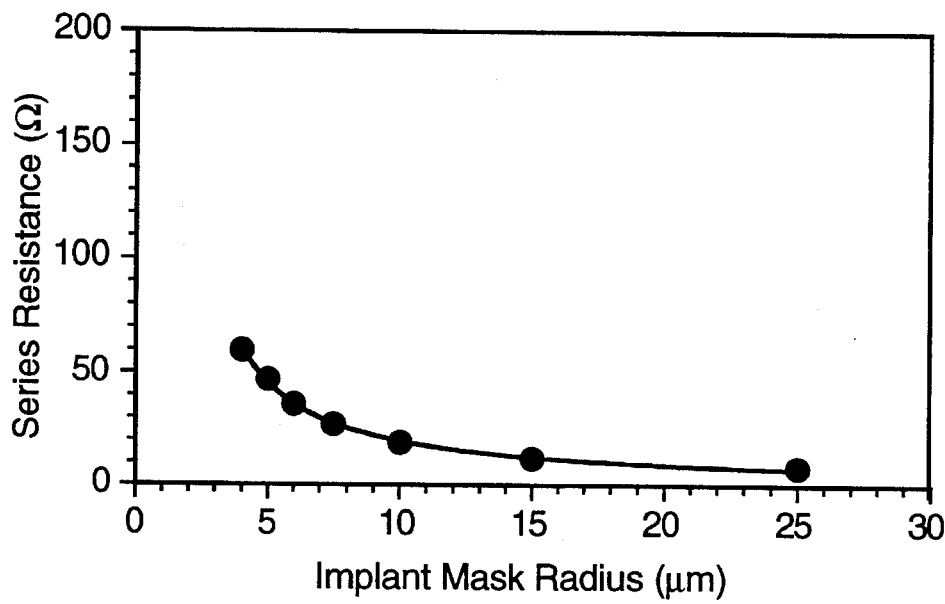
FIGS. 8a and 8b show the measured size dependence of the series electrical resistance and thermal resistance for VCSELs including the p-type DBR mirror of FIGS. 7a and 7b fabricated according to the present invention.
Figure 8B:
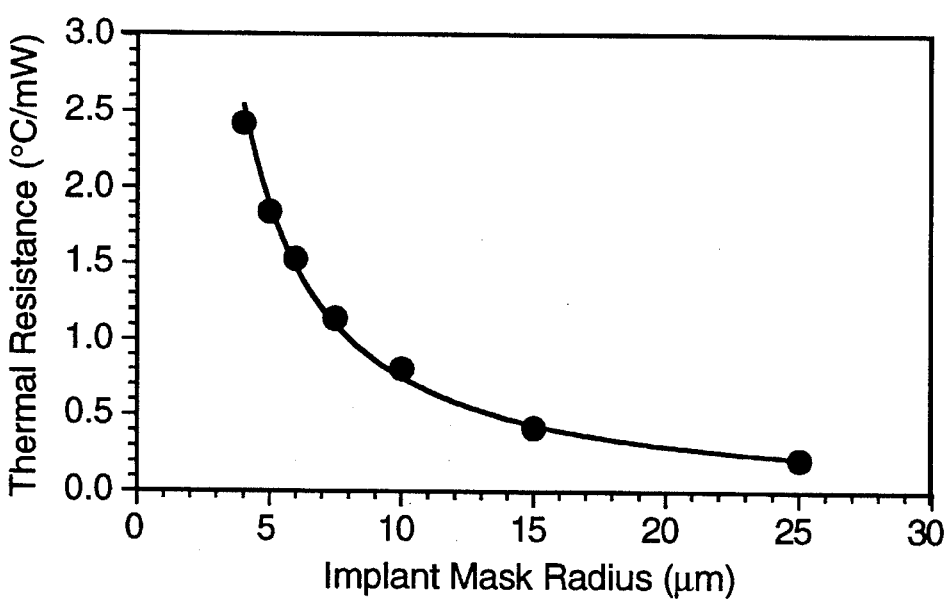

FIGS. 8a and 8b show the measured size dependence of the series electrical resistance and thermal resistance for the VCSEL devices 10 having a p-type DBR mirror according to FIG. 7a and 7b. In FIG. 8a and 8b, the VCSEL devices 10 fabricated according to the present invention show simultaneously a reduction in the lateral electrical resistance, $R_S$, the vertical electrical resistance, $R_V$, and also the thermal resistance as compared to the prior-art piecewise-linearly-graded VCSELs of FIGS. 6a and 6b. For the VCSEL devices in FIG. 8a, the lateral electrical resistance fitting parameter, $R_L$, was calculated to be 0.016 Ω-cm, representing a fourfold reduction in the lateral electrical resistance from the value measured for the prior-art piecewise-linearly-graded VCSELs of FIG. 6a. The vertical electrical resistance fitting parameter, $R_V$, in FIG. 8a was calculated to be $9.8 \times 10^{-6}$ Ω-cm², about 2.5 times lower than the value for the prior-art piecewise-linearly-graded VCSELs of FIG. 6a.

In FIG. 8b, the thermal resistance curve shows that the thermal resistance is also reduced as compared to the prior-art piecewise-linearly-graded VCSELs of FIG. 6b. This reduction in the thermal resistance in the VCSELs 10 fabricated according to the present invention is due to a reduced alloy content which reduces alloy scattering in the asymmetrically-graded DBR mirrors below that of the prior-art piecewise-linearly-graded DBR mirrors.

Reduced electrical and thermal resistance (and thus reduced heat generation) combines with an improved thermal conductivity in the present VCSEL devices 10 to impact device efficiency and performance by providing a substantial reduction in an operating temperature of the devices. This has resulted in lasing action in VCSELs 10 having sizes ranging from 2.5 to 25 μm, and has also increased the maximum light output power (both a single-lateral-mode power and a multiple-lateral-mode power) of the VCSEL devices 10. The highest measured single-lateral-mode power for the present devices was about 4.4 mW for a 4 μm-radius VCSEL 10 (which operates single-frequency with a transverse-mode suppression ratio of up to 40 dB); and the highest multiple-lateral-mode power was measured to be 23 mW for a 25 μm-radius VCSEL.

Although a higher light output power is possible with a larger size VCSEL, many applications of VCSELs such as optical fiber communications or optical interconnects require only a modest power level of about 1 mW. For such applications, a smaller size VCSEL device 10 may be preferred to reduce a lasing threshold current and to provide a single-mode output beam. For example, a 6 μm-radius VCSEL fabricated according to the present invention had a measured threshold current of about 3 mA, and produced 1 mW of light output power at about 5 mA current with a bias voltage of only about 1.75 V.

Figure 9:
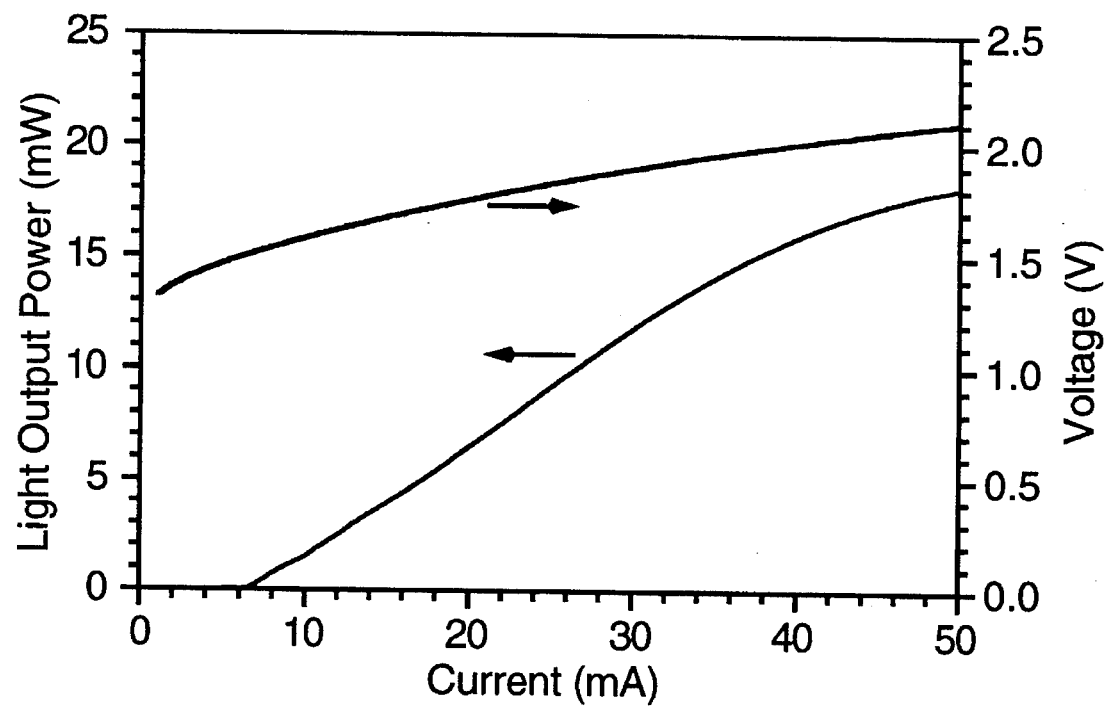
FIG. 9 shows light output power versus current and voltage versus current curves for a vertical-cavity surface-emitting laser according to the present invention.

FIG. 9 shows a light-versus-current (L-I) curve and a voltage-versus-current (V-I) curve for a VCSEL device 10 fabricated according to the present invention with a 15 μm radius. This VCSEL with a 22-pair second DBR mirror lases at a wavelength near 950 nm, with a lasing threshold current of about 6.5 mA. The maximum CW light output power for this device was about 18 mW at 50 mA current while having an operating voltage of only about 2.1 volts. The V-I curve for this VCSEL is substantially linear with a series electrical resistance of less than about 15 Ω, and a bias voltage that extrapolates to a value close to a bandgap energy of the active region at zero current. A low voltage drop across the DBR mirrors (14 and 16) together with the low threshold current and a high slope efficiency result in an electrical-to-optical power conversion efficiency of about 21% at 30 mA current (and a light output power of about 12 mW). The efficiency of the VCSEL fabricated according to the present invention represents a significant advance over the 15.8% efficiency of the prior-art piecewise-linearly-graded VCSEL of FIGS. 5a and 5b and FIGS. 6a and 6b that was obtained at about 10 mA current and with less than 4 mW of light output power.

Figure 10B:
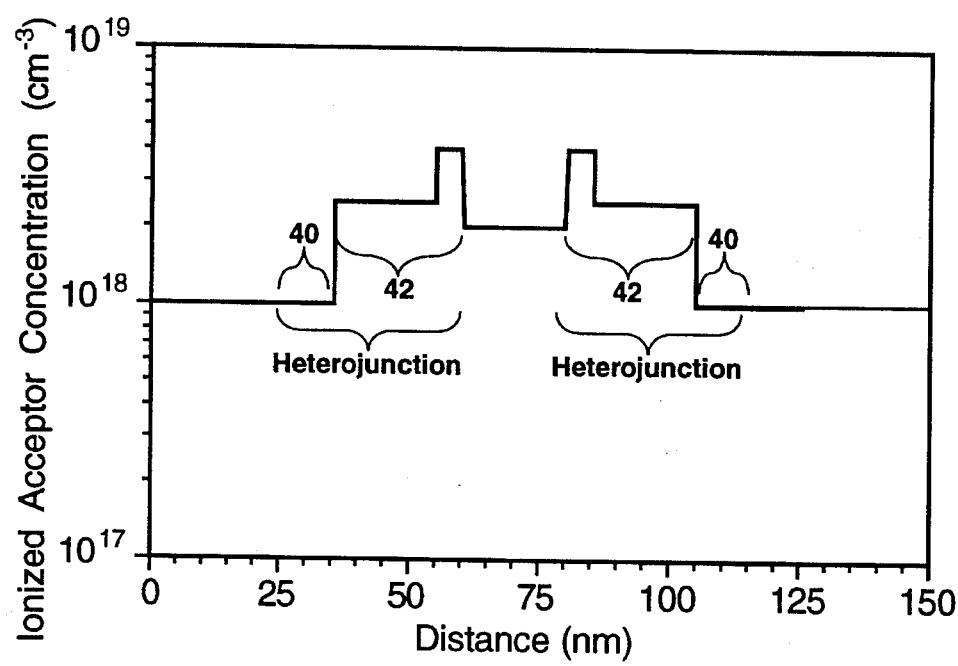

FIGS. 10a and 10b show the variation of aluminum composition, x, with distance in the growth direction and the ionized acceptor concentration with distance, respectively, for a portion of a second example of a p-type DBR mirror designed according to the present invention for an operation at a wavelength near 850 nm. In the second example in FIG. 10a, the high-refractive-index first semiconductor layers 32 are comprised of $Al_{0.15}Ga_{0.85}As$; and the low-refractive-index second semiconductor layers 34 are comprised of AlAs. The asymmetrically-graded heterojunction between each pair of semiconductor layers (32 and 34) includes an accumulation region 40 in which the composition varies abruptly from $Al_{0.15}Ga_{0.85}As$ (i.e. the first composition) to $Al_{0.3}Ga_{0.7}As$ (i.e. the third composition), and a depletion region 42 in which the composition in a first segment thereof is varied semiparabolically from $Al_{0.3}Ga_{0.7}As$ (i.e. the third composition) to a fourth composition 46 that is $Al_{0.9}Ga_{0.1}As$, and in a second segment thereof is abruptly varied from the fourth composition 46 to the second composition which is AlAs. The abrupt transition in the second segment of the depletion region 42 may be used for overcoming mass flow controller limitations of MOCVD as described heretofore (and may also be used for overcoming difficulties of MBE temperature ramping).

FIG. 10b shows a doping profile for the second example of the p-type DBR mirror. For a complex doping profile such as shown in FIG. 10b, carbon may be preferred over other p-type dopants such as Be, since a carbon dopant provides a low diffusivity and a high solubility which produces a dopant profile that is more stable at a high growth temperature (e.g. 750° C.) during the long period of time (up to several hours) required for growth of the optical device 10.

In FIG. 10b, an ionized acceptor concentration of the p-type dopant is stepped from about $10^{18}$ cm$^{-3}$ in the high-refractive-index first semiconductor layers 32 (and in the accumulation regions 40 of the heterojunction), to about $2.5 \times 10^{18}$ cm$^{-3}$ for the semiparabolically-graded first segment of the depletion layer 42, and then to about $4 \times 10^{18}$ cm$^{-3}$ for the abrupt second segment of the depletion layer 42, and finally to about $2 \times 10^{18}$ cm$^{-3}$ for the remainder of the low-refractive-index second layer 34. This stepped doping profile (i.e. modulation doping) assists in flattening the valence band in each segment of the depletion region, with the higher doping concentration in the second segment of the depletion region being preferred to compensate for an increased hole mass and a higher density of states therein; and thereby assisting in aligning the valence band to a substantially flat-band condition across the depletion region 42.

Figure 11:
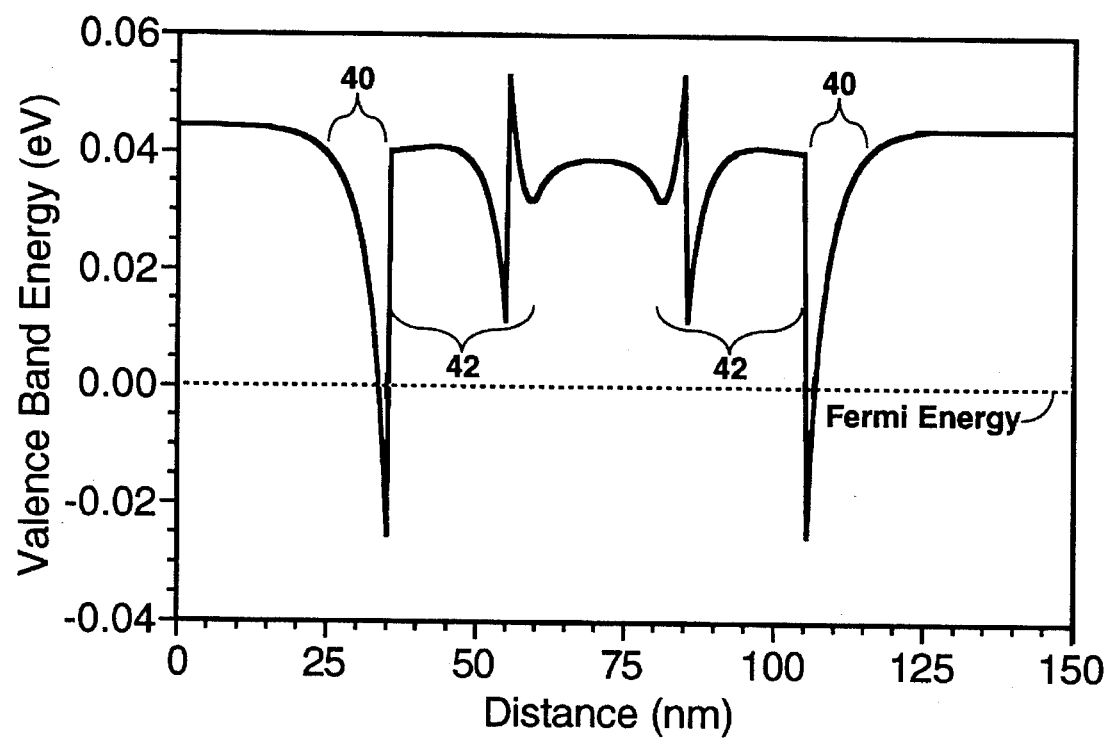
FIG. 11 shows a calculated equilibrium valence band energy diagram for the portion of the second example of the p-type DBR mirror in FIGS. 10a and 10b.

FIG. 11 shows a calculated equilibrium valence band energy diagram for the portion of the second example of the p-type DBR mirror in FIGS. 10a and 10b. In FIG. 11 the potential energy barrier generated by the abrupt change in composition in the depletion region 42 is shown. By breaking up the depletion region 42 into a plurality of segments, a height in energy and a thickness of any potential energy barriers due to the abrupt change in composition may both be substantially reduced, thereby allowing carriers to flow across the barriers by tunneling and/or thermal activation. The accumulation regions 40 in this second example of the present invention have an energy depth (about 3 kT) that is larger than the first example of the invention, thereby increasing a lateral transport of holes by the formation of a two-dimensional hole gas.

Although the present invention has been described for $Al_xGa_{1-x}As$ semiconductor layers grown by MOCVD, it will be evident to those skilled in the art that the teaching of the present invention may be applied to other epitaxial growth methods (including MBE) and to other types of III–V and II–VI compound semiconductors, including InP, InGaAs, InAlAs, InGaP, AlGaAsP, AlGaInP, InCaAsP, InAlGaAs, or the like. Furthermore, although the present invention has been described primarily for VCSELs, it will be evident to those skilled in the art that the teaching of the present invention may be used for the formation of other types of optical devices including LEDs, RCLEDs, RCPDs, and the like and also for compound-semiconductor electrical devices having graded heterojunctions.

The asymmetrically-graded heterojunctions as described herein have been described for semiconductor layers formed within a DBR mirror. However, the asymmetric grading of heterojunctions as taught according to the present invention may be applied to semiconductor layers formed elsewhere within an optical device 10 (or any compound semiconductor electrical device having a graded heterojunction as known to the art), for example, within the active region 18 or at any interface between two semiconductor layers having an offset in a valence band, or a conduction band, or both.

The matter set forth in the foregoing description and accompanying drawings is offered by way of illustration only and not as a limitation. Other applications and variations of the precision cleaning apparatus and method will become evident to those skilled in the art. The actual scope of the invention is intended to be defined in the following claims when viewed in their proper perspective based on the prior art.

What is claimed is:

1. An optical device comprising at least one distributed Bragg reflector mirror having at least one pair of semiconductor layers epitaxially grown one upon another, one layer in each pair having an index of refraction which is different from the index of refraction of the other layer in each pair, any two adjacent semiconductor layers of the distributed Bragg reflector mirror forming a heterojunction, a first layer of the two adjacent layers having a first composition and a first bandgap and a second layer of the two adjacent layers having a second composition and a second bandgap, the second bandgap being greater than the first bandgap, characterized in that a first region of each heterojunction adjacent to the first layer is composition graded from the first composition to a third composition intermediate between the first and second compositions, and a second region of each heterojunction adjacent to the second layer is composition graded from the third composition to the second composition, the second region having a smaller variation in composition with distance in the growth direction than the first region.

2. The optical device of claim 1 in which a thickness in the growth direction of the first region of each heterojunction is smaller than the thickness of the second region of each heterojunction.

3. The optical device of claim 1 in which an absolute magnitude of a second derivative of a bandgap energy with distance in the growth direction is smaller in the second region than in the first region.

4. The optical device of claim 1 in which the second region of each heterojunction is at least in part semiparabolically graded in composition.

5. The optical device of claim 1 in which the first and second regions of each heterojunction are at least in part semiparabolically graded in composition.

6. The optical device of claim 1 in which the second region is modulation doped.

7. The optical device of claim 1 in which the distributed Bragg reflector mirror is a unipolar, p-type structure.

8. The optical device of claim 1 in which the device is a light-emitting device selected from the group consisting of a vertical-cavity surface-emitting laser, a light-emitting diode, and a resonant-cavity light-emitting diode.

9. The optical device in claim 1 in which the device is a resonant-cavity photodetector.

10. An optical device comprising at least one distributed Bragg reflector mirror having at least one pair of semiconductor layers epitaxially grown one upon another, one layer in each pair having an index of refraction which is different from the index of refraction of the other layer in each pair, any two adjacent semiconductor layers of the distributed Bragg reflector mirror forming a heterojunction, a first layer of the two adjacent layers having a first composition and a first bandgap and a second layer of the two adjacent layers having a second composition and a second bandgap, the second bandgap being greater than the first bandgap, characterized in that a first region of each heterojunction adjacent to the first layer is abruptly varied in composition from the first composition to a third composition intermediate between the first and second compositions, and a second region of each heterojunction adjacent to the second layer is smoothly varied in composition from the third composition to the second composition.

11. The optical device of claim 10 in which a thickness in the growth direction of the first region of each heterojunction is smaller than the thickness of the second region of each heterojunction.

12. The optical device of claim 10 in which an absolute magnitude of a second derivative of a bandgap energy with distance in the growth direction is smaller in the second region than in the first region.

13. The optical device of claim 10 in which the second region of each heterojunction is at least in part semiparabolically graded in composition.

14. The optical device of claim 10 in which the first and second regions of each heterojunction are at least in part semiparabolically graded in composition.

15. The optical device of claim 10 in which the second region is modulation doped.

16. The optical device of claim 10 in which the distributed Bragg reflector mirror is a unipolar, p-type structure.

17. The optical device of claim 10 in which the device is a light-emitting device selected from the group consisting of a vertical-cavity surface-emitting laser, a light-emitting diode, and a resonant-cavity light-emitting diode.

18. The optical device in claim 10 in which the device is a resonant-cavity photodetector.

19. An optical device comprising:
   (a) n-type and p-type semiconductor distributed Bragg reflector mirrors, each mirror having at least one pair of semiconductor layers epitaxially grown one upon another, one layer in each pair of semiconductor layers having an index of refraction which is different from the index of refraction of the other layer in each pair of semiconductor layers, any two adjacent semiconductor layers of the distributed Bragg reflector mirror forming a heterojunction, a first layer of the two adjacent layers having a first composition and a first bandgap and a second layer of the two adjacent layers having a second composition and a second bandgap, the second bandgap being greater than the first bandgap,
      characterized in that a first region of each heterojunction adjacent to the first layer is composition graded from the first composition to a third composition intermediate between the first and second compositions, and a second region of each heterojunction adjacent to the second layer is composition graded from the third composition to the second composition, the second region having a smaller variation in composition with distance in the growth direction than the first region;
   (b) an active region formed between the n-type and p-type mirrors; and
   (c) electrodes operatively connected to the n-type and p-type mirrors for applying a bias voltage therebetween.

20. The optical device of claim 19 in which a thickness in the growth direction of the first region of each heterojunction is smaller than the thickness of the second region of each heterojunction.

21. The optical device of claim 19 in which an absolute magnitude of a second derivative of a bandgap energy with distance in the growth direction is smaller in the second region than in the first region.

22. The optical device of claim 19 in which the second region of each heterojunction is at least in part semiparabolically graded in composition.

23. The optical device of claim 19 in which the first and second regions of each heterojunction are at least in part semiparabolically graded in composition.

24. The optical device of claim 19 in which the second region is modulation doped.

25. The optical device of claim 19 in which the device is a light-emitting device selected from the group consisting of a vertical-cavity surface-emitting laser, a light-emitting diode, and a resonant-cavity light-emitting diode.

26. The optical device of claim 19 in which the device is a resonant-cavity photodetector.

27. The optical device of claim 19 further including a plurality of pairs of dielectric layers formed above the last-grown distributed Bragg reflector mirror for increasing a reflectivity thereof, the index of refraction of one dielectric layer in each pair of dielectric layers being different from the other dielectric layer in each pair of dielectric layers.

28. An optical device comprising:
   (a) n-type and p-type semiconductor distributed Bragg reflector mirrors, each mirror having at least one pair of semiconductor layers epitaxially grown one upon another, one layer in each pair having an index of refraction which is different from the index of refraction of the other layer of the pair, any two adjacent semiconductor layers forming a heterojunction, a first layer of the two adjacent layers having a first composition and a first bandgap and a second layer of the two adjacent layers having a second composition and a second bandgap, the second bandgap being greater than the first bandgap,
      characterized in that a first region of each heterojunction adjacent to the first layer of at least one of the distributed Bragg reflector mirrors is abruptly varied in composition from the first composition to a third composition intermediate between the first and second compositions, and a second region of each heterojunction adjacent to the second layer of the same at least one distributed Bragg reflector mirror is smoothly varied in composition from the third composition to the second composition;
   (b) an active region formed between the n-type and p-type mirrors; and
   (c) electrodes operatively connected to the n-type and p-type mirrors for applying a bias voltage therebetween.

29. The optical device of claim 28 in which the second region of each heterojunction is semiparabolically graded in composition.

30. The optical device of claim 28 in which the second region is modulation doped.

31. The optical device of claim 28 in which the device is a light-emitting device selected from the group consisting of a vertical-cavity surface-emitting laser, a light-emitting diode, and a resonant-cavity light-emitting diode.

32. The optical device of claim 28 further including a plurality of pairs of dielectric layers formed above one of the distributed Bragg reflector mirrors for increasing a reflectivity thereof, the index of refraction of one dielectric layer in each pair of dielectric layers being different from the other dielectric layer in each pair of dielectric layers.

33. The optical device of claim 28 in which the device is a light-emitting device selected from the group consisting of a vertical-cavity surface-emitting laser, a light-emitting diode, and a resonant-cavity light-emitting diode.

34. The optical device of claim 28 in which the device is a resonant-cavity photodetector.

\* \* \* \* \*